United States Patent
Pagani et al.

(10) Patent No.: US 9,007,806 B2
(45) Date of Patent: Apr. 14, 2015

(54) ELECTROMECHANICAL INTEGRATED MEMORY ELEMENT AND ELECTRONIC MEMORY COMPRISING THE SAME

(71) Applicant: STMicroelectronics S.r.l., Agrate Brianza (IT)

(72) Inventors: Alberto Pagani, Nova Milanese (IT); Marco Morelli, Bareggio (IT); Giulio Ricotti, Broni (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 158 days.

(21) Appl. No.: 13/782,263

(22) Filed: Mar. 1, 2013

(65) Prior Publication Data

US 2013/0242636 A1    Sep. 19, 2013

(30) Foreign Application Priority Data

Mar. 15, 2012 (IT) .............. TO2012A0224

(51) Int. Cl.
| | | |
|---|---|---|
| *G11C 11/00* | (2006.01) | |
| *G11C 23/00* | (2006.01) | |
| *H01H 1/00* | (2006.01) | |
| *G11C 11/50* | (2006.01) | |
| *H01H 59/00* | (2006.01) | |
| *H01H 1/52* | (2006.01) | |

(Continued)

(52) U.S. Cl.
CPC ............. *G11C 23/00* (2013.01); *H01H 1/0036* (2013.01); *G11C 11/50* (2013.01); *H01H 59/0009* (2013.01); *H01H 1/52* (2013.01); *G11C 7/02* (2013.01); *G11C 7/1048* (2013.01); *G11C 7/12* (2013.01); *G11C 5/005* (2013.01); *G11C 29/12* (2013.01); *G11C 2029/0409* (2013.01)

(58) Field of Classification Search
CPC .... G11C 11/50; G11C 23/00; G02B 27/0176; G02B 26/0841
USPC ........... 365/129, 189.01, 189.05, 164, 51, 63; 369/126
See application file for complete search history.

(56) References Cited

U.S. PATENT DOCUMENTS

| | | | |
|---|---|---|---|
| 4,979,149 A | 12/1990 | Popovic et al. | |
| 5,677,823 A | 10/1997 | Smith | |

(Continued)

FOREIGN PATENT DOCUMENTS

WO    WO-2010107876 A1    9/2010

OTHER PUBLICATIONS

Italian Search Report and Written Opinion for IT TO2012A000224 mailed Aug. 9, 2012 (7 pages).

Hutchby, Jim and Garner, Mike: Assessment of the Potential & Maturity of Selected Emerging Research Memory Technologies Workshop & ERD/ERM Working Group Meeting (Apr. 6-7, 2010), Jul. 23, 2010 (55 pages).

Carbonero, Jean-Louis, et al: "Comparison Between Beryllium-Copper and Tungsten High Frequency Air Coplanar Probes," IEEE Transactions on Microwave Theory and Techniques, vol. 43, No. 12, Dec. 1995 (8 pages).

(Continued)

*Primary Examiner* — Gene Auduong
(74) *Attorney, Agent, or Firm* — Gardere Wynne Sewell LLP

(57) ABSTRACT

An electromechanical memory element includes a fixed body and a deformable element attached to the fixed body. An actuator causes a deformation of the deformable element from a first position (associated with a first logic state) to a second position (associated with a second logic state) where a mobile element makes contact with a fixed element. A programming circuit then causes a weld to be formed between the mobile element and the fixed element. The memory element is thus capable of associating the first and second positions with two different logic states. The weld may be selectively dissolved to return the deformable element back to the first position.

26 Claims, 17 Drawing Sheets

(51) Int. Cl.
*G11C 7/02* (2006.01)
*G11C 7/10* (2006.01)
*G11C 7/12* (2006.01)
*G11C 5/00* (2006.01)
*G11C 29/12* (2006.01)
*G11C 29/04* (2006.01)

(56) References Cited

U.S. PATENT DOCUMENTS

| | | |
|---|---|---|
| 6,509,605 B1 | 1/2003 | Smith |
| 6,625,047 B2 | 9/2003 | Coleman, Jr. |
| 7,839,710 B2 * | 11/2010 | Kam et al. ................. 365/215 |
| 8,436,700 B2 * | 5/2013 | Schmit et al. ............... 335/78 |
| 8,810,528 B2 * | 8/2014 | Bita et al. .................. 345/173 |
| 2008/0061922 A1 | 3/2008 | Nakamura et al. |
| 2008/0135386 A1 | 6/2008 | Bozler et al. |
| 2009/0129139 A1 | 5/2009 | Kam et al. |
| 2009/0207717 A1 | 8/2009 | Van Kampen |
| 2011/0067982 A1 | 3/2011 | Schmit et al. |

OTHER PUBLICATIONS

Timsit, R.S.: "Electrical Contact Resistance: Properties of Stationary Interfaces," IEEE 1998, pp. 1-19.
Timsit, R.S.: "Electrical Contact Resistance: Properties of Stationary Interfaces," IEEE Mar. 1999, pp. 85-98.
Kister, January: "Introduction to Physics of Contact Resistance," Probe Technology, SouthWest Test Workshop, San Diego, 1998 (17 pages).
Broz, Jerry J., et al.: "Low and Stable Contact Resistance With Reduced Cleaning . . . a Paradigm Shift," Advanced Probing Systems, Inc., SWTW '99, Jun. 7, 1999, Texas Instruments (pp. 1-35).
King Liu, Prof. Tsu-Jae: "M/NEMS for Memory Applications," Department of Electrical Engineering and Computer Sciences, University of California, Berkeley, CA, May 15, 2008 (29 pages).
Broz, Jerry J., et al: "Probe Contact Resistance Variations During Elevated Temperature Wafer Test," ITC International Test Conference, IEEE 1999, pp. 396-405.

* cited by examiner

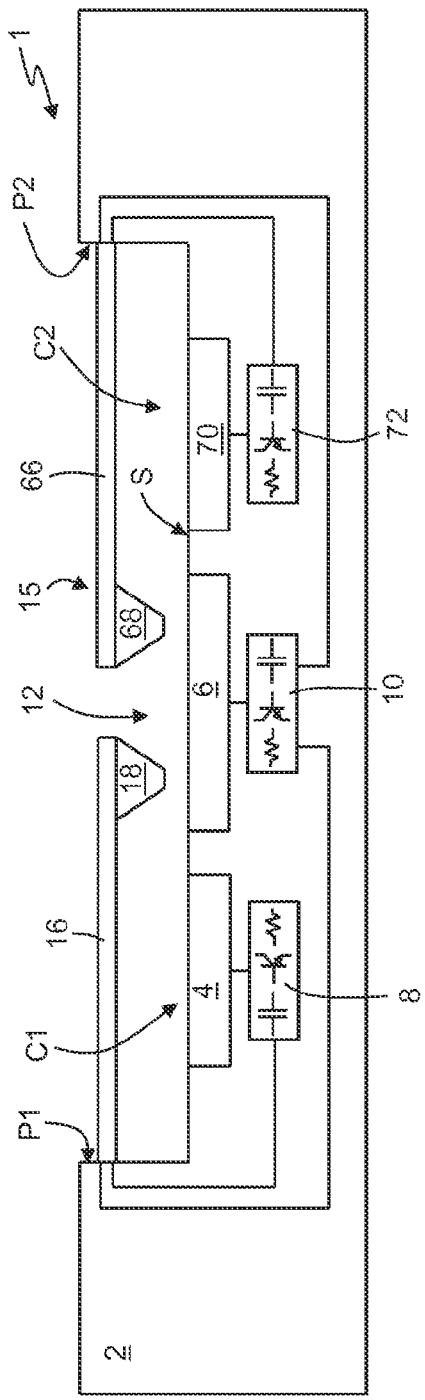
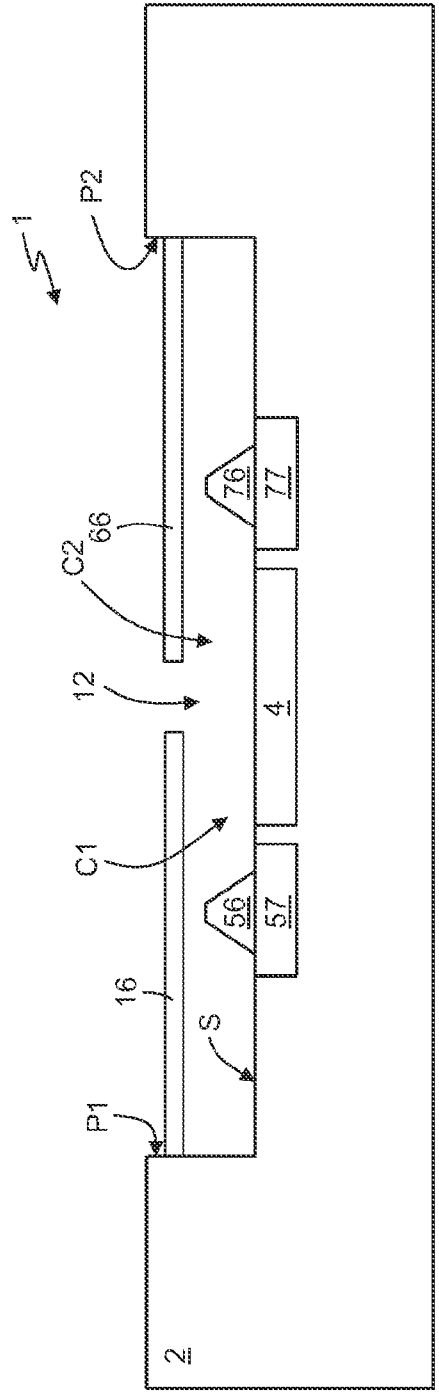
Fig.11
Fig.12

ELECTROMECHANICAL INTEGRATED MEMORY ELEMENT AND ELECTRONIC MEMORY COMPRISING THE SAME

PRIORITY CLAIM

This application claims priority from Italian Application for Patent No. TO2012A000224 filed Mar. 15, 2012, the disclosure of which is hereby incorporated by reference.

TECHNICAL FIELD

The present invention relates to an electromechanical integrated memory element and to an electronic memory comprising the same.

BACKGROUND

As is known, currently available are memories of an electromechanical type, each of which is formed by an array of memory elements of an electromechanical type, which are designed to store information.

In general, each electromechanical memory element can operate in two different states, each of which can hence be associated to a corresponding information bit. In other words, each electromechanical memory element can vary a mechanical characteristic of its own, in such a way as to enable a corresponding coding of information.

More particularly, electromechanical memory elements are known designed to modify the shape or arrangement of respective mechanical elements, in an electronically controllable way.

For example, U.S. Pat. No. 4,979,149, the disclosure of which is incorporated by reference, describes an electromechanical memory element comprising a mechanical component that undergoes plastic deformation alternatively into a first position, where it exhibits a first curvature, or a second position, where it exhibits a second curvature, it being possible to associate said first and second positions to corresponding information bits.

The U.S. Pat. No. 7,839,710, the disclosure of which is incorporated by reference, describes, instead, an electromechanical memory element including a cantilever element, the arrangement of which in the space is controlled by using electrostatic forces. In particular, thanks to the use of said electrostatic forces, the cantilever element is set alternatively in a first position, where it is in contact with a substrate, or else in a second position, where it is separate from the substrate. Once the cantilever element is brought into contact with the substrate, the contact between the cantilever element and the substrate is maintained by forces of adhesion that originate in the points of contact between the cantilever element and the substrate, these forces of adhesion being greater than the elastic force associated to the deformation of the cantilever element. It is hence possible to associate a corresponding bit to the position assumed by the cantilever element, this information being maintained over time precisely thanks to the action of the forces of adhesion. More in particular, the information is maintained until the cantilever element is moved away from the substrate by applying an appropriate voltage to a control electrode.

In practice, if the two surfaces, respectively of the cantilever element and of the substrate, between which the forces of adhesion are set up are referred to as "surfaces of adhesion", programming and holding of the information depends upon the conditions in which the surfaces of adhesion are found. In the case of an electromechanical memory formed by a plurality of electromechanical memory elements, the conditions can vary from one electromechanical memory element to another, with consequent limitation of the reliability of the memory itself. In fact, the conditions of the surfaces of adhesion are not easily reproducible (in an exact way) from one electromechanical memory element to another.

There is accordingly a need to provide an electromechanical memory element that will solve at least in part the drawbacks of the known art.

SUMMARY

According to an embodiment, an electromechanical memory element and an electronic memory are provided.

In an embodiment, an apparatus includes an electromechanical memory element which comprises: a fixed supporting body; a first mobile device including a first deformable element constrained to said fixed supporting body, said first mobile device defining a first mobile contact element; a fixed contact element fixed with respect to the fixed supporting body; an actuator configured to deform the first deformable element so as to set the first mobile device in a first position, where the first mobile contact element is separate from the fixed contact element, or in a second position, where the first mobile contact element is in contact with the fixed contact element, said first and second positions being associable to two different logic states; and a programming circuit configured to co-operate with the actuator to form, if the first mobile device is in the second position and the first mobile contact element and the fixed contact element are not welded together, a weld between the first mobile contact element and the fixed contact element.

In an embodiment, an apparatus includes an electromechanical memory element which comprises: a supporting body including a cavity; a mobile contact element extending into said cavity; a fixed contact element located within said cavity; an actuator configured to cause movement of said mobile contact element within said cavity between a first position where the mobile contact element is separated from the fixed contact element and a second position where the mobile contact element is in contact with the fixed contact element; a programming circuit configured to cause a weld to be formed between the mobile contact element and the fixed contact element when at the second position.

In an embodiment, a method comprises: applying a force to move a mobile contact element from a first position where the mobile contact element is separated from the fixed contact element to a second position where the mobile contact element is in contact with the fixed contact element; and passing a first programming current through the mobile contact element and fixed contact element while the force is applied to cause a weld to be formed between the mobile contact element and the fixed contact element when at the second position.

BRIEF DESCRIPTION OF THE DRAWINGS

For a better understanding of the present invention preferred embodiments thereof are now described, purely by way of non-limiting example, with reference to the attached drawings, wherein:

FIGS. 9a-9c and 10-12 are schematic cross sections of further embodiments of the present electromechanical memory element;

DETAILED DESCRIPTION OF THE DRAWINGS

Figure 1:
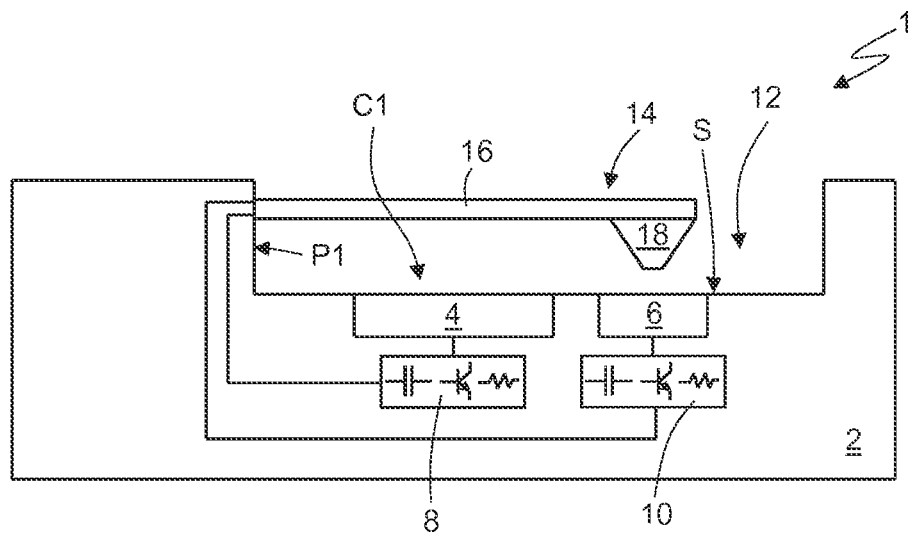
FIG. 1 is a schematic cross section of an embodiment of the present electromechanical memory element, in a first operating state.
Figure 2:
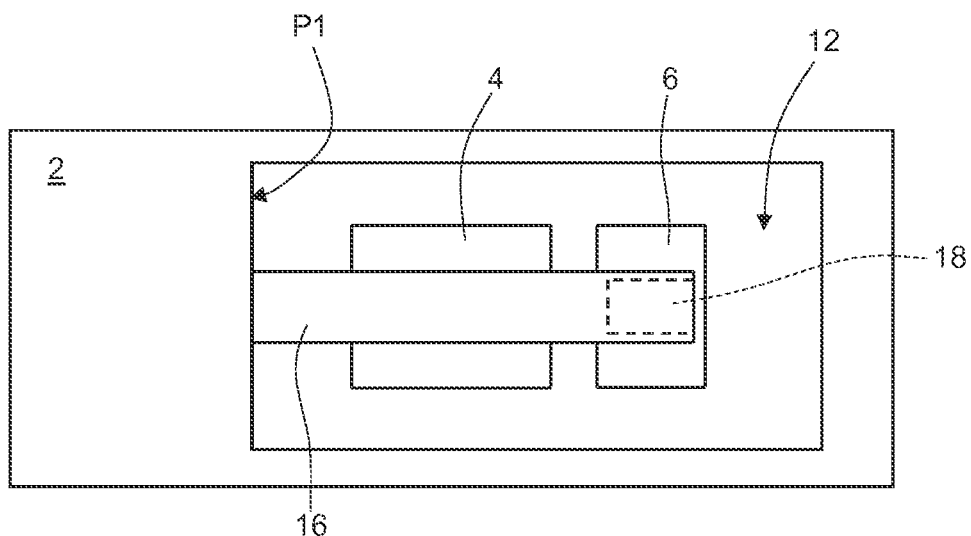
FIG. 2 is a schematic top plan view, with portions removed, of the embodiment shown in FIG. 1.

FIGS. 1 and 2 show an electromechanical memory element 1, which comprises a fixed supporting body 2, formed in which are a first conductive element 4 and a first fixed contact element 6. In a way in itself known, the fixed supporting body 2 may comprise a body of semiconductor material (not shown) and/or one or more regions of dielectric or conductive material (not shown). Moreover formed inside the fixed supporting body 2 are a first electronic circuit 8 and a second electronic circuit 10, which are electrically connected, respectively, to the first conductive element 4 and to the first fixed contact element 6. In addition, the fixed supporting body 2 defines a recess 12, delimited by a bottom surface S and by one or more side walls, the number of side walls depending upon the shape of the recess 12. For example, in the present description, it is assumed that the recess 12 has the shape, in top plan view, of a rectangle, and hence has four side walls, even though it may assume shapes of a different type.

The electromechanical memory element 1 further comprises a first mobile body 14, which includes a first cantilever element 16 and a first mobile contact element 18. The first cantilever element 16 is constrained at a first end to a first side wall P1 and extends inside the recess 12, overlying, at a distance, the first conductive element 4 and the first fixed contact element 6, which are arranged at a lateral distance from one another. The first cantilever element 16 is moreover electrically connected both to the first electronic circuit 8 and to the second electronic circuit 10. The first mobile contact element 18 is constrained to a second end of the first cantilever element 16 and overlies, at a distance, the first fixed contact element 6.

The first fixed contact element 6, the first cantilever element 16, and the first mobile contact element 18 are made of metal materials such as, for example: copper, aluminum, tungsten, cobalt, palladium, rhodium, gold, nickel, or corresponding alloys. In addition, each of the first fixed contact element 6, the first cantilever element 16, and the first mobile contact element 18 may be formed by a plurality of layers of not necessarily conductive material, provided that at least the outer layer is made of conductive material.

Each of the first fixed contact element 6, the first cantilever element 16, and the first mobile contact element 18 may hence be made up, for example, by a set of layers, this set including an outer layer that coats on the outside the subset of layers formed by all the other layers. Moreover possible are further embodiments, in which the first cantilever element 16 is made of possibly doped semiconductor material and is coated with a conductive layer.

In what follows reference is made, for simplicity of description, to the case where the first fixed contact element 6, the first cantilever element 16, and the first mobile contact element 18 are made, each, of a single material. In particular, it is assumed that the first cantilever element 16, the first fixed contact element 6, and the first mobile contact element 18 are made, respectively, of a first material, a second material, and a third material. The ensuing description can in any case be generalized, for example, to the aforementioned case where one or more among the first cantilever element 16, the first fixed contact element 6, and the first mobile contact element 18 are formed by a respective plurality of layers, the outermost layers of each plurality being made, respectively, of the first material, the second material, and the third material.

This being said, the first cantilever element 16 is a linear beam, which extends, in a first operating state, parallel to the bottom surface S of the recess 12. The first operating state is absolutely stable and is characterized in that it is not possible to cause current to flow between the first mobile contact element 18 and the first fixed contact element 6. In addition, the first operating state can be associated, purely by way of example, to a logic state '0'. In addition to this, the first cantilever element 16 defines a sort of first plate of a first capacitor C1, the second plate of which is defined by the first conductive element 4.

Figure 3:
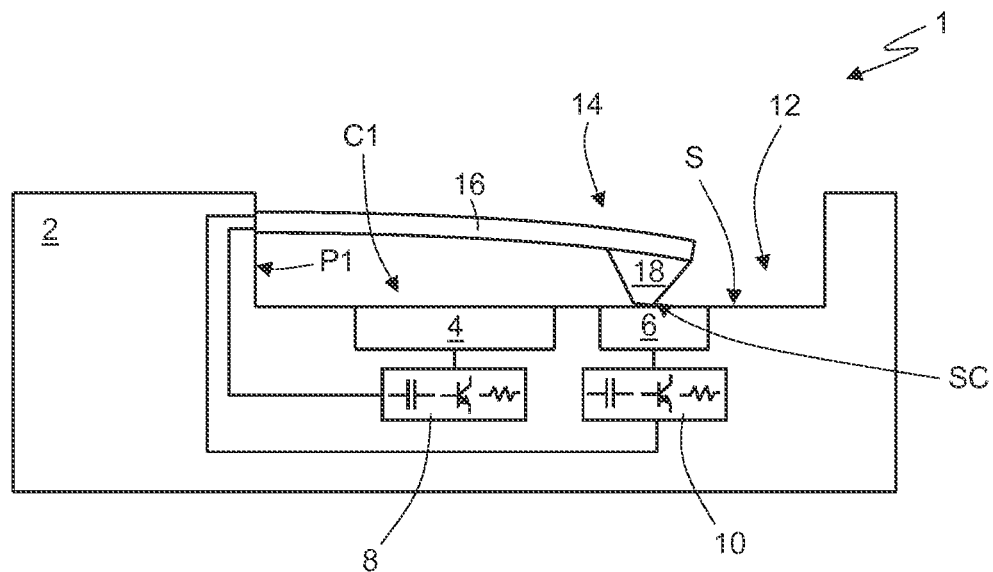
FIGS. 3 and 4 are schematic cross sections of the embodiment shown in FIGS. 1 and 2, in a second operating state.

Operatively, by applying a voltage between the first cantilever element 16 and the first conductive element 4, i.e., by biasing the aforementioned first capacitor C1, the first electronic circuit 8 generates an electrostatic force such as to bend the first cantilever element 16 towards the bottom surface S of the recess 12. In particular, the electrostatic force is such that the first cantilever element bends until it assumes a position such that the first mobile contact element 18, which was previously separate from the first fixed contact element 6, is in direct contact with the first fixed contact element 6, as shown in FIG. 3. Consequently, the first mobile contact element 18 and the first fixed contact element 6 define a contact surface SC. In order to limit the area of the contact surface SC, for the reasons described hereinafter, the first mobile contact element 18 has a pointed shape, such as for example a triangular, trapezial, or cusp shape. The first mobile contact element 18 may hence be made, for example, by using the so-called NEMS (nano-electromechanical systems) technologies, which enable creation of tips with a diameter of some nanometers, for example 10 nm or less. Alternatively, also MEMS (micro-electromechanical systems) technologies can be used, which enable creation of tips with a diameter of some microns, for example 10 µm or less.

Following upon bending, the first cantilever element 16 hence assumes a second operating state, which is in itself unstable in so far as the first cantilever element 16 tends to return into the first operating state. It is in any case possible to associate the second operating state, purely by way of example, to a logic state '1'.

In order to store the logic state '1', the second electronic circuit 10 forces passage of a programming current through the first cantilever element 16 and the contact surface SC.

Figure 4:
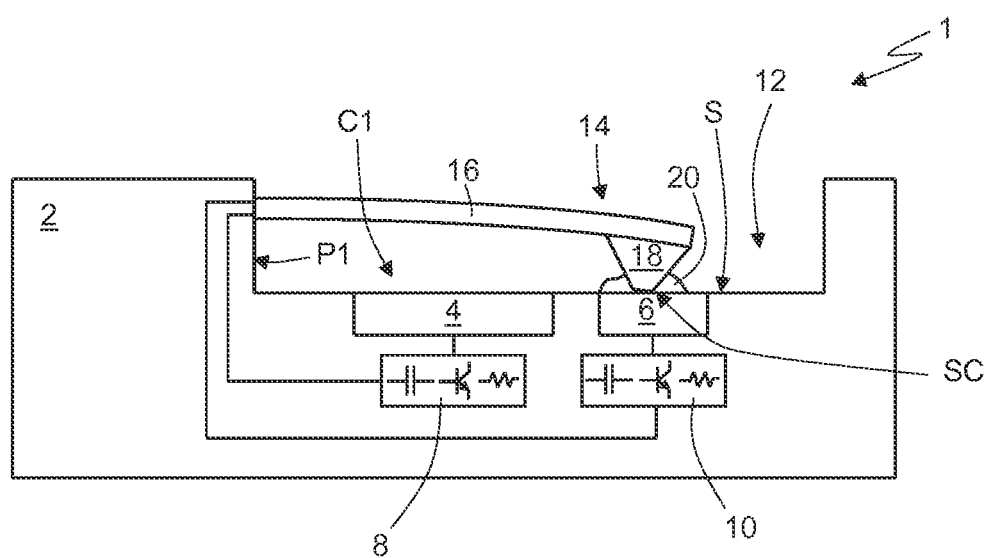

Since the contact surface SC has a limited area, the current density that traverses the contact surface SC itself is particularly high. Consequently, on the contact surface SC, there is an increase in temperature, which leads to formation of a weld 20 (FIG. 4) between the first mobile contact element 18 and the first fixed contact element 6. In this way, even when the first electronic circuit 8 stops biasing the first capacitor C1, i.e., even in the absence of electrostatic forces, the first mobile contact element 18 and the first fixed contact element 6 remain fixed with respect to one another, preventing the first cantilever element 16 from returning into the first operating state. In this way, there occurs a storage of the logic state '1', which is hence associated to the possibility of causing current to flow between the first mobile contact element 18 and the first fixed contact element 6.

More in particular, in order to enable welding, the second material has a melting point lower than the melting point of the first material in such a way that, following upon passage of the programming current through the contact surface SC, there occurs partial melting of the first fixed contact element 6, whilst the first cantilever element 16 keeps its own mechanical properties substantially unaltered. In other words, the first cantilever element 16 maintains an elastic, and hence linear, behavior, enabling the logic state stored to be varied a number of times.

Following upon partial melting of the first fixed contact element 6, the second electronic circuit 10 interrupts the flow of the programming current through the contact surface SC in such a way that there occurs a corresponding reduction of temperature and a solidification of the previously molten material, which forms intermetal bonds with the first mobile contact element 18. The weld 20 is thus obtained.

In regard to the third material, it may have a melting point higher than the melting point of the second material in such a way that the first mobile contact element 18 remains in the solid state during the process of formation of the weld 20. There are, however, possible embodiments in which the melting point of the third material is lower than the melting point of the second material, as well as than the melting point of the first material. In this case, during the process of formation of the weld 20, there occurs partial melting of the first mobile contact element 18, instead of the first fixed contact element 6. Also in this case, however, the first cantilever element 16 keeps its own mechanical properties substantially unaltered.

In order to restore the logic state '0', the second electronic circuit 10 forces passage of an erasure current through the first cantilever element 16 and the contact surface SC in such a way as to heat the weld 20. For example, the erasure current may be equal to the programming current. In this way, the elastic forces associated to bending of the first cantilever element 16 cause detachment of the first mobile contact element 18 from the first fixed contact element 6, and consequently a release of the first cantilever element 16, which returns into the first operating state.

Figure 5:
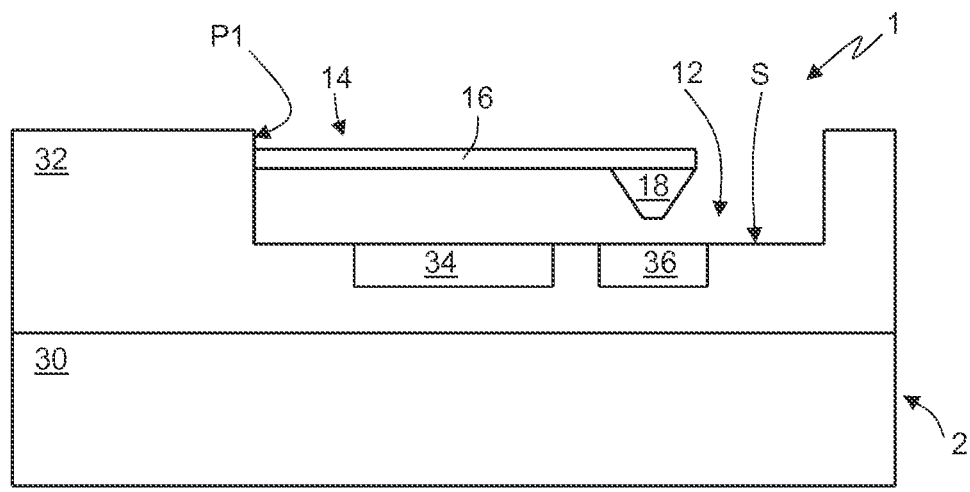
FIG. 5 is a schematic cross section of an embodiment of the present electromechanical memory element, in the first operating state.

Purely by way of example, the electromechanical memory element 1 can be provided during the so-called steps of a "back-end of line" (BEOL) process, i.e., during the step of fabrication of the metal layers of an integrated circuit. In this case, as shown in FIG. 5, where for simplicity the first and second electronic circuits 8, 10 are not shown, the fixed supporting body 2 comprises a body of semiconductor material 30 and a top region 32, which extends over the body of semiconductor material 30 and defines the recess 12. In particular, the top region 32 is formed by dielectric and/or metal material, and moreover defines the bottom surface S of the recess 12 and the first side wall P1, to which the first end of the first cantilever element 16 is constrained.

In this embodiment, the first conductive element is defined by a first metallization 34, which faces the bottom surface S. Moreover, the first fixed contact element is defined by a second metallization 36, which is arranged at a lateral distance from the first metallization 34 and faces the bottom surface S.

Figure 6:
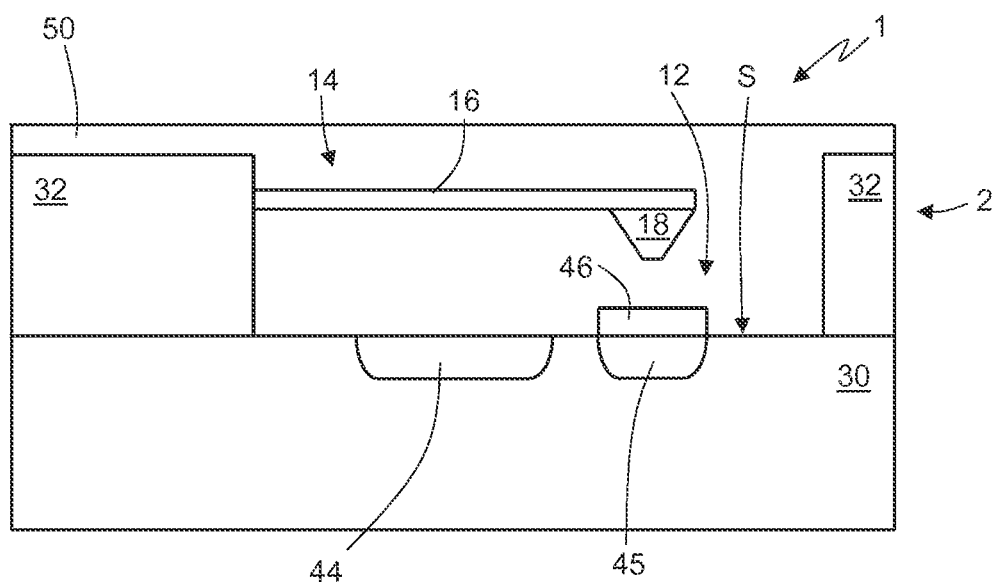
FIGS. 6-8 are schematic cross sections of embodiments of the present electromechanical memory element, during respective steps of respective manufacturing processes.

As shown in FIG. 6, the electromechanical memory element 1 can also be provided at least in part during the so-called steps of a "front-end of line" (FEOL) process, i.e., during the steps immediately subsequent to prearrangement of the wafer of semiconductor material.

In this case, the first side wall P1 is once again defined by the top region 32, but the bottom surface S of the recess 12 is defined by the body of semiconductor material 30. In addition, the first conductive element is defined by a first well 44, which is formed inside the body of semiconductor material 30, extends from the bottom surface S and has alternatively a P or N doping. Moreover present inside the body of semiconductor material 30 is moreover a second well 45, which is arranged at a lateral distance from the first well 44, extends from the bottom surface S, and has alternatively a P or N doping. The first fixed contact element is once again defined by the second metallization, here designated by 46, which is arranged on top of the second well 45, with which it is in direct contact.

In practice, as shown once again in FIG. 6, during the process of formation of this embodiment, it happens that above the top region 32 and inside the recess 12 a filling region 50 is present, made, for example, of dielectric material, which is subsequently removed from the recess 12, in a way in itself known. FIG. 6, as on the other hand also the subsequent FIGS. 7 and 8, hence regards an instant in which the process of formation of the electromechanical memory element 1 is not yet through. This process of formation is precisely terminated with removal of the filling region 50 in such a way as to enable movement of the first mobile body 14.

Figure 7:
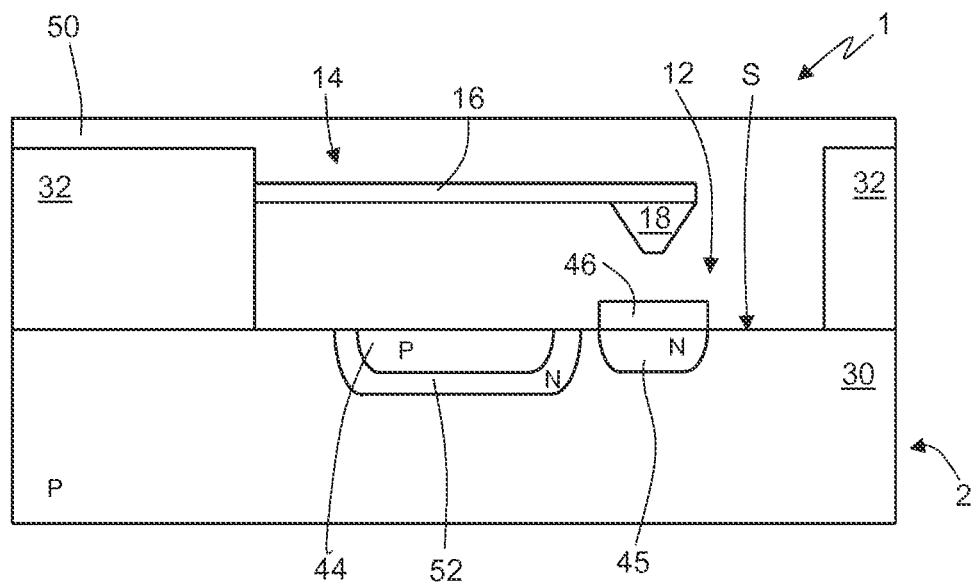

As shown in FIG. 7, inside the body of semiconductor material 30 there may be present at least one further well, such as for example a third well 52.

For example, the third well 52 may extend from the bottom surface S of the recess 12, arranged at a lateral distance from the second well 45. Moreover, the first well 44 may extend inside the third well 52 so as to be surrounded by the latter. In this case, the first well 44 and the body of semiconductor material 30 have a first type of doping (for example, a P doping), whilst the second and third wells 45, 52 have a second type of doping (for example, an N doping). Consequently, the first well 44 can be biased independently of the body of semiconductor material 30.

Figure 8:
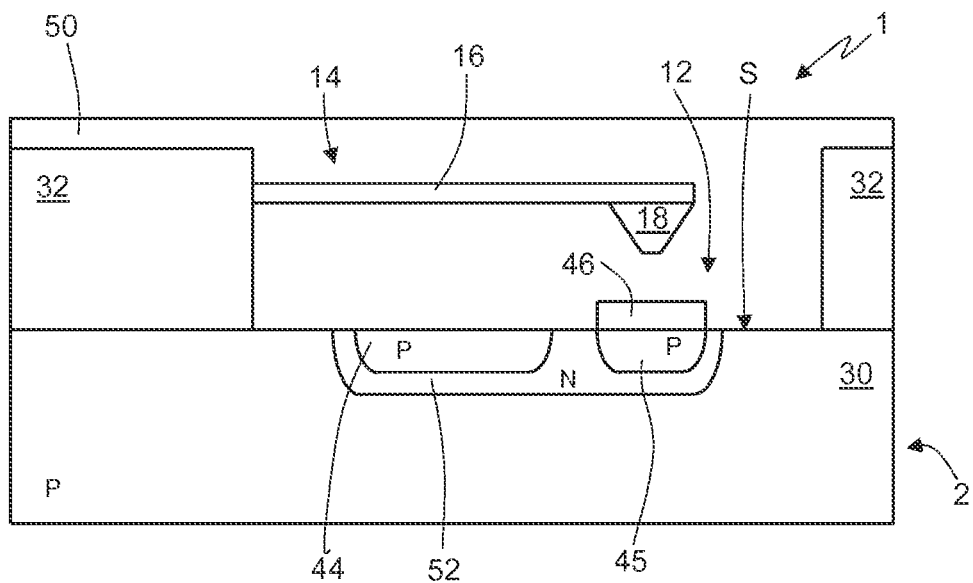

As shown in FIG. 8, it is moreover possible for the second well 45 to extend also inside the third well 52. In this case, the second well 45 has a doping of the first type.

Figure 9A:
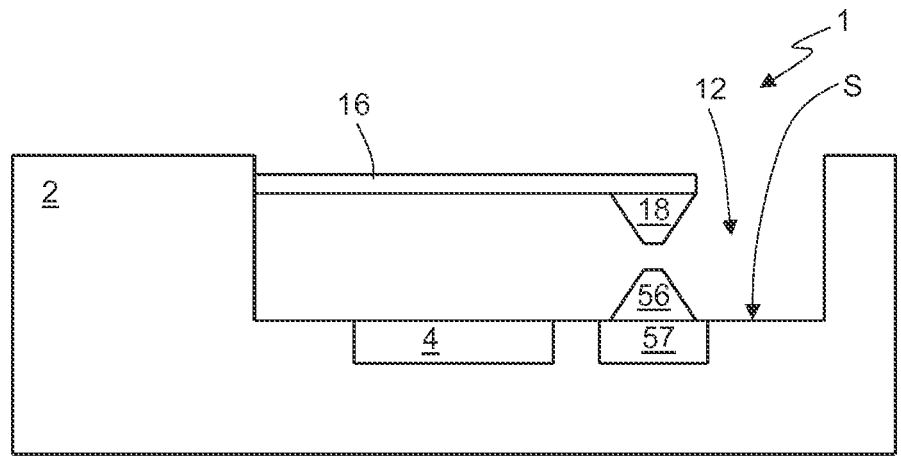

As shown in FIG. 9a, moreover possible are embodiments in which the first fixed contact element (here designated by 56) is arranged on top of the bottom surface S of the recess 12, hence outside the fixed supporting body 2, with which it is in direct contact. In this case, the first fixed contact element 56 may rest on a first conductive region 57, arranged between the first fixed contact element 56 and the second electronic circuit 10 (not shown in FIG. 9a) and extending inside the fixed supporting body 2 starting from the bottom surface S. The first fixed contact element 56 is once again made of the second material and may have a pointed shape, such as, for example, a triangular, trapezial, or cusp shape. More in particular, assuming that the first mobile contact element 18 and the first fixed contact element 56 define respective single-tip shapes, the first mobile contact element 18 and the first fixed contact element 56 are arranged in such a way that the two tips defined thereby face one another.

Figure 9B:
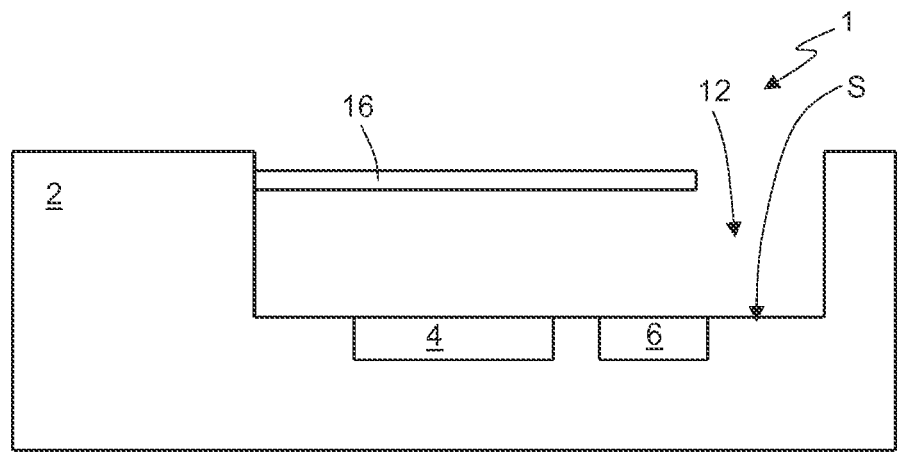
Figure 9C:
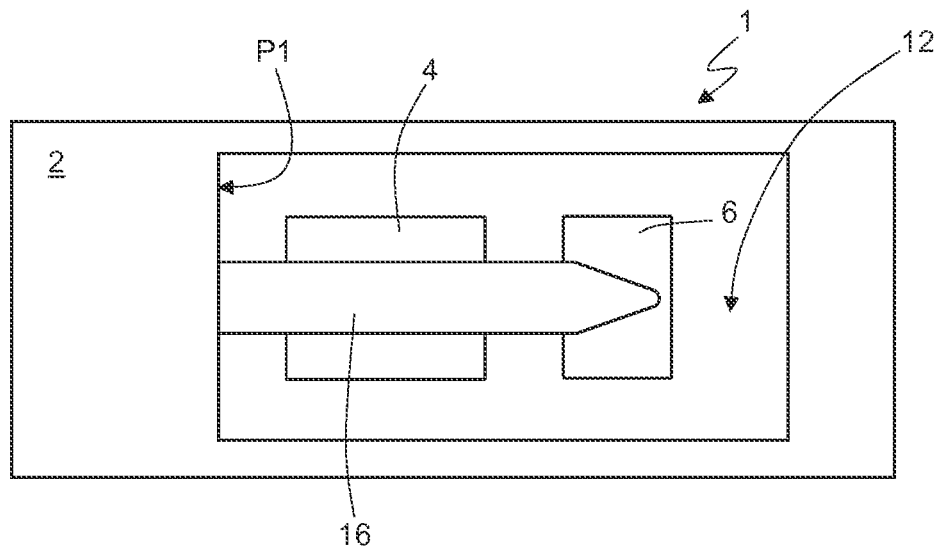

As shown in FIG. 9b, moreover possible are embodiments in which the first mobile contact element 18 is absent. In this case, it is the second end itself of the first cantilever element 16, i.e., the end that is not constrained, that functions as first mobile contact element, and hence contacts (in the second operating state) the first fixed contact element 6. In other words, the third material coincides with the first material. Furthermore, as shown in FIG. 9c, the second end of the first cantilever element 16 is tapered so as to define a tip, which, in the second operating state, contacts the first fixed contact element 6. In the absence of the first mobile contact element 18, the first cantilever element 16 may be set closer to the first conductive element 4, consequently increasing the electrostatic forces and reducing the overall encumbrance of the electromechanical memory element 1.

Figure 10:
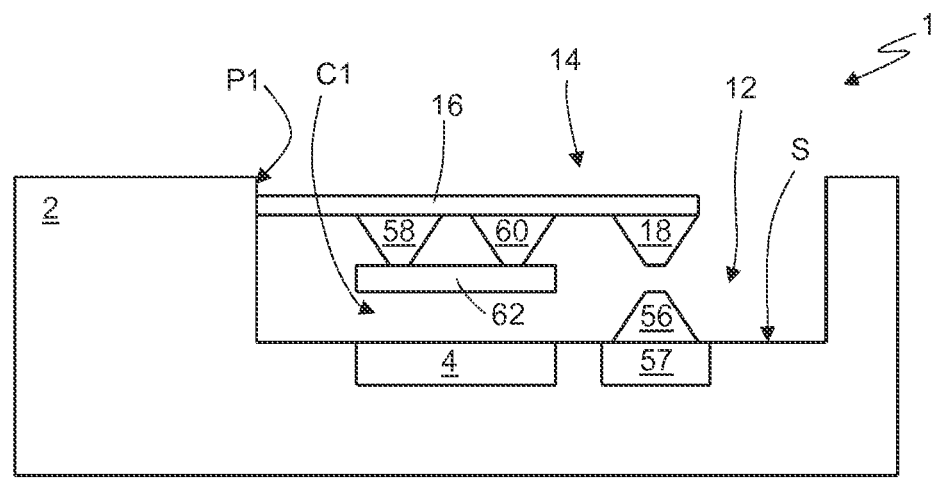

As shown in FIG. 10, it is moreover possible to reduce the distance between the first and second plates of the first capacitor C1. For this purpose, the electromechanical memory element 1 may include a first connection element 58 and a second connection element 60, as well as an additional element 62.

The first and second connection elements 58, 60 are constrained to the first cantilever element 16, are arranged at a lateral distance from one another and are arranged between the first side wall P1 and the first mobile contact element 18. The additional element 62 is in turn constrained to the first and second connection elements 58, 60, extends parallel to the bottom surface S of the recess 12, and overlies, at a distance, the first conductive element 4, without contacting any side wall of the recess 12.

The first and second connection elements 58, 60 are made of conductive material. In addition, the additional element 62 is made of conductive material, in such a way that it functions as the first plate of the first capacitor C1, the second plate being once again defined by the first conductive element 4. Since the first and second plates are arranged at a close distance, it is possible to generate a particularly intense electrostatic force.

Albeit not shown, moreover possible are embodiments in which the first and second connection elements 58, 60 and the additional element 62 are constrained to the first conductive element 4, instead of to the first cantilever element 16.

As shown in FIG. 11, the electromechanical memory element 1 may include also a second cantilever element 66, which extends inside the recess 12 from a second side wall P2. In particular, in the first operating state, the second cantilever element 66 extends parallel to the bottom surface S of the recess 12 and is arranged specularly with respect to the first cantilever element 16. Consequently, the first and second side walls P1 and P2 are arranged facing one another.

The electromechanical memory element 1 further comprises a second mobile contact element 68, constrained to a second end of the second cantilever element 66, the first end of the second cantilever element 66 being constrained to the second side wall P2. In the first operating state, the second mobile contact element 68 overlies, at a distance, the first fixed contact element 6, with which it hence comes into contact in the second operating state. The second mobile contact element is, for example, the same as the first mobile contact element 18. In practice, the second cantilever element 66 and the second mobile contact element 68 define a second mobile body 15.

In this embodiment, the electromechanical memory element 1 comprises a second conductive element 70, which faces the bottom surface S of the recess 12, is set at a lateral distance from the first fixed contact element 6, and is overlaid, at a distance, by the second cantilever element 66. In particular, the second conductive element 70 is arranged in such a way that the first fixed contact element 6 is arranged between the first and second conductive elements 4, 70. Albeit not shown, the first and second conductive elements 4, 70 may be electrically connected together.

In practice, the second cantilever element 66 and the second conductive element 70 define, respectively, a first plate and a second plate of a second capacitor C2.

In this embodiment, the second electronic circuit 10 is also connected to the second cantilever element 66. In addition, the electromechanical memory element 1 comprises a third electronic circuit 72, which is connected to the second cantilever element 66 and to the second conductive element 70. Consequently, the third electronic circuit 72 is able to bias the second capacitor C2, thus generating an electrostatic force designed to bend the second cantilever element 66.

In this way, it is possible to store two bits, using a single fixed contact element.

As shown in FIG. 12, moreover possible are embodiments comprising both the first cantilever element 16 and the second cantilever element 66, but without the first and second mobile contact elements 18, 68. In this case, the first fixed contact element 56 is arranged on top of the bottom surface S of the recess 12. Moreover present are a second fixed contact element 76 and a second conductive region 77.

In particular, the second fixed contact element 76 is, for example, the same as the first fixed contact element 56 and extends on top of the bottom surface S of the recess 12. The second conductive region 77 is arranged between the second fixed contact element 76 and the second electronic circuit 10, to which it is connected, and extends inside the fixed supporting body 2 from the bottom surface S. More in particular, the second conductive region 77 is overlaid by the second fixed contact element 76. Moreover, the first and second conductive regions 57, 77 are arranged at a lateral distance in such a way that the first conductive element 4 is arranged between the first and second conductive regions 57, 77. The first cantilever element 16 overlies the first fixed contact element 56 and a first portion of the first conductive element 4, whereas the second cantilever element 66 overlies the second fixed contact element 76 and a second portion of the first conductive element 4.

Operatively, the first conductive element 4 functions as second plate both for the first capacitor C1 and for the second capacitor C2, the respective first plates of which are again defined, respectively, by the first and second cantilever elements 16, 66.

In this way, it is possible store two bits, using a single conductive element.

Moreover possible are embodiments (not illustrated) in which the first conductive element 4 and the first fixed contact element 6 face not the bottom surface S of the recess 12, but rather a third side wall of the recess 12, in such a way that, in passing from the first operating state to the second operating state, the first cantilever element 16 bends parallel with respect to the bottom surface S of the recess 12.

Figure 13:
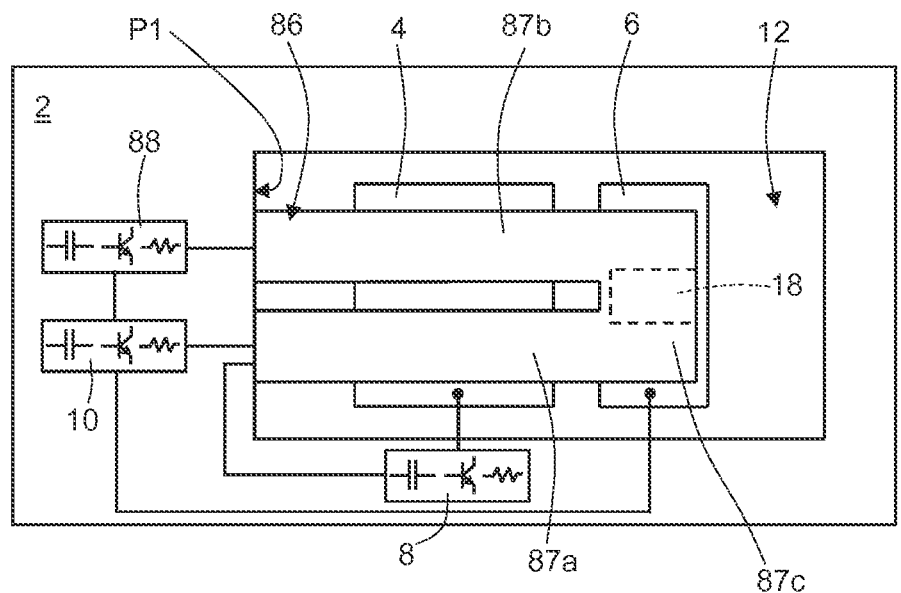
FIG. 13 shows a schematic top plan view of a further embodiment of the present electromechanical memory element.

According to yet a different embodiment, shown in FIG. 13, the first cantilever element, here designated by 86, is formed by a first subelement, a second subelement, and a third subelement, 87a-87c respectively. The first and second subelements 87a, 87b extend in cantilever fashion from the first side wall P1, to which they are constrained, whilst the third subelement 87c radiuses together the first and second subelements 87a, 87b. In addition, the first mobile contact element 18 is constrained to the third subelement 87c.

In other words, the first cantilever element 86 has a U shape, the first and second ends of which are defined, respectively, by the first and second subelements 87a, 87b and are both constrained to the first side wall P1. The first end of the first cantilever element 86 is once again connected to the second electronic circuit 10. In addition, inside the fixed supporting body 2 a fourth electronic circuit 88 is present, which is electrically connected to the second end of the first cantilever element 86, as well as to the second electronic circuit 10. In this way, it is possible, for example by means of co-operation between the second and fourth electronic circuits 10, 88, to apply a voltage between the first and second ends of the first cantilever element 86, and consequently verify whether through the first cantilever element 86 there is generated a flow of testing current. In the case where the flow of the testing current is set up, it is possible to deduce information on correct fabrication of the first cantilever element 86.

Moreover possible are embodiments (not shown) in which constrained to the first cantilever element 86, and in particular to the third subelement 87c, are a number of mobile contact elements, for example the same as the first mobile contact element 18. By so doing, mobile contact elements redundant with respect to the first mobile contact element 18 are introduced, thus increasing the service life of the electromechanical memory element 1. In further embodiments, the first cantilever element 86 may be V-shaped.

Figure 14:
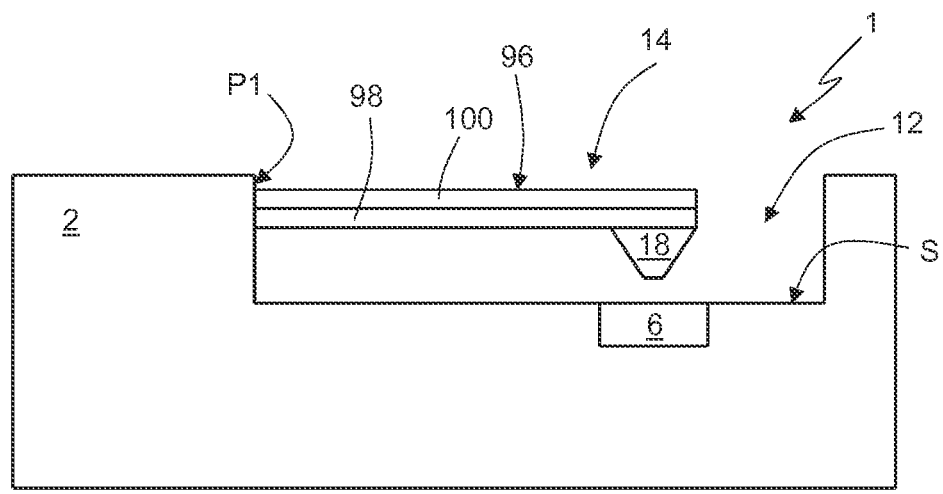
FIG. 14 shows a schematic cross section of a further embodiment of the present electromechanical memory element.
Figure 15:
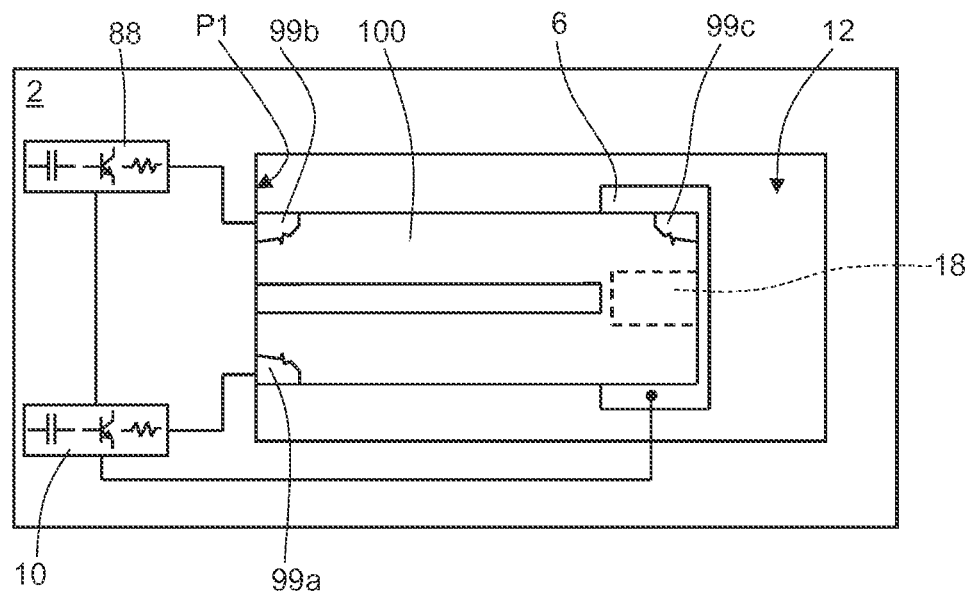
FIG. 15 is a schematic top plan view of the embodiment of the present electromechanical memory element shown in FIG. 14.

As shown in FIGS. 14 and 15, it is moreover possible for the first conductive element not to be present. In this case, the first cantilever element, here designated by 96, comprises a first layer 98 and a second layer 100, which have different coefficients of thermal expansion. In particular, the first layer 98 is made of the first material, whilst the second layer 100 is made of a fourth material, which is conductive and has a melting point higher than at least one between the melting points of the second and third materials. Furthermore, the fourth material has a coefficient of thermal expansion higher than the coefficient of thermal expansion of the first material.

In detail, the first layer 98 comprises a first portion, a second portion, and a third portion 99a-99c. The first and second portions 99a, 99b extend in cantilever fashion from the first side wall P1, to which they are constrained, whilst the third portion 99c radiuses together the first and second portions 99a, 99b. Moreover, the first mobile contact element 18 is constrained to the third portion 99c. In other words, the first layer 98 has a U shape, the first and second ends of which are defined, respectively, by the first and second portions 99a, 99b and are both constrained to the first side wall P1.

The second layer 100 coats at the top the first layer 98 and has a shape, in top plan view, that is the same as the shape of the first layer 98. Alternatively, the first layer 98 may also be V-shaped.

As shown qualitatively in FIG. 15, the first electronic circuit 8 is absent. The second electronic circuit 10 is connected to the first portion 99a of the first layer 98, as well as to the first fixed contact element 6. The fourth electronic circuit 88 is connected to the second portion 99b of the first layer 98, as well as to the second electronic circuit 10.

Operatively, in the first operating state, the first and second layers 98, 100 extend parallel to the bottom surface S of the recess 12, preventing contact between the first mobile contact element 18 and the first fixed contact element 6.

Starting from the first operating state, the second and fourth electronic circuits 10, 88 can co-operate to cause a control current to flow inside the first and second layers 98, 100, thus generating an increase in temperature inside the first and second layers 98, 100. Since the coefficient of thermal expansion of the first layer 98 is lower than the coefficient of thermal expansion of the second layer 100, the increase in temperature causes bending of the first cantilever element 96, and in particular bending of the latter in the direction of the bottom surface S. In this way, a condition is reached in which the first mobile contact element 18 contacts the first fixed contact element 6, without using electrostatic forces to bend the first cantilever element 96, hence without the need to use the first electronic circuit 8 or the first conductive element 4.

Once the first mobile contact element 18 and the first fixed contact element 6 are in mutual contact, it is possible to program the logic state '1'. For this purpose, the second electronic circuit 10 forces passage of the programming current through the first cantilever element 96 and through the contact surface SC formed between the first mobile contact element 18 and the first fixed contact element 6, with consequent melting and subsequent solidification (following upon interruption of the programming current) of one between the first mobile contact element 18 and the first fixed contact element 6. In this way, when the second and fourth electronic circuits 10, 88 no longer generate any current between the control current and the programming current, the first mobile contact element 18 and the first fixed contact element 6 remain fixed with respect to one another, preventing the first cantilever element 96 from returning into the first operating state. It should be noted that, preferably, during the operations of melting and subsequent solidification, the control current continues to flow in the first cantilever element 96, and in particular through the first, second, and third portions 99a-99c of the first layer 98, so as to maintain contact between the first mobile contact element 18 and the first fixed contact element 6, until solidification is completed.

In order to restore the logic state '0', the second electronic circuit 10 forces passage of the erasure current through the first portion 99a of the first layer 98 and the contact surface SC in such a way as to heat the weld 20. At the same time, the fourth electronic circuit 88 prevents passage of the control current in the first cantilever element 96 so as not to hinder release of the first cantilever element 96. For example, the erasure current may be equal to the programming current. In this way, the elastic forces associated to bending of the first cantilever element 96 cause detachment of the first mobile contact element 18 from the first fixed contact element 6, and consequently a release of the first cantilever element 96.

Figure 16:
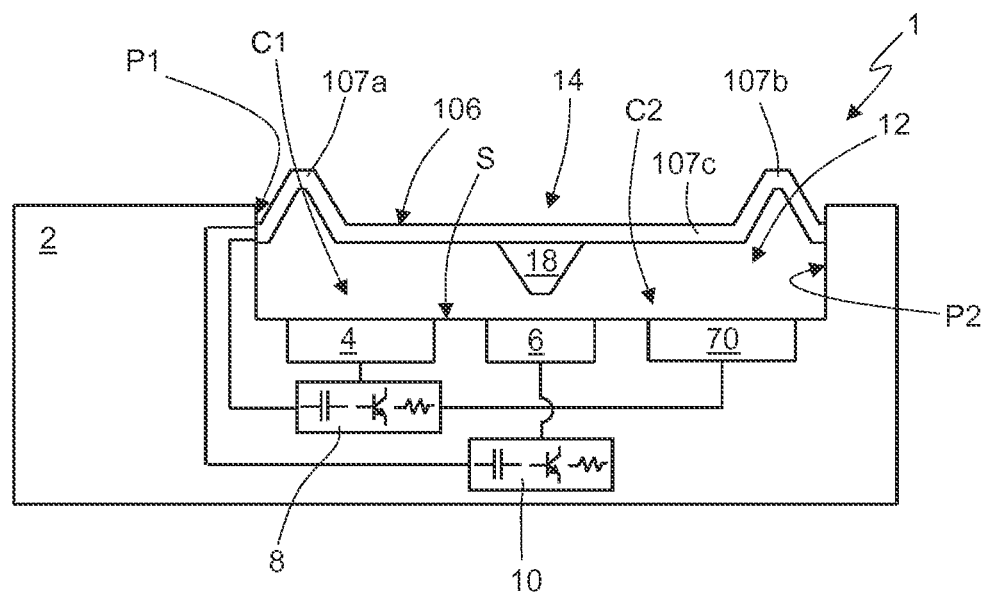
FIGS. 16-19 are schematic cross sections of further embodiments of the present electromechanical memory element.

As shown in FIG. 16, moreover possible are embodiments based once again on the use of electrostatic forces, where the first mobile body 14 comprises, instead of the first cantilever element, a suspended element 106, which is constrained at a first end to the first side wall P1 and at a second end to the second side wall P2. The suspended element 106 hence overlies, at a distance, the bottom surface S of the recess 12.

In detail, in this embodiment, the electromechanical memory element 1 includes the first and second conductive elements 4, 70, arranged between which is the first fixed contact element 6.

In greater detail, the suspended element 106 is made of the first material and comprises a first portion, a second portion, and a third portion 107a-107c, the first and second portions 107a, 107b being, respectively, constrained to the first and second walls P1, P2, the third portion 107c being set between the first and second portions 107a, 107b, to which it is connected. Furthermore, the third portion 107c of the suspended element 106 has a linear shape and carries the first mobile contact element 18. The first and second portions 107a, 107b have, instead, geometrical shapes such as to bestow thereon stiffness lower than that of the third portion 107c.

The suspended element 106 defines the first plates of the first and second capacitors C1, C2, the respective second plates of which are defined, respectively, by the first and second conductive elements 4, 70. The first electronic circuit 8 is connected to the first and second conductive elements 4, 70, as well as to the suspended element 106. The second electronic circuit 10 is also connected to the suspended element 106, as well as to the first fixed contact element 6.

Operatively, following upon biasing of the first and second capacitors C1 and C2 by the first electronic circuit 8, bending takes place of the first and second portions 107a, 107b of the suspended element 106, with consequent translation of the third portion 107c towards the bottom surface S. In particular, the third portion 107c translates vertically remaining to a first approximation parallel to the bottom surface S, until the first mobile contact element 18 contacts the first fixed contact element 6. Next, the second electronic circuit 10 forces passage of the programming current through the suspended element 106 and the contact surface SC that is formed between the first mobile contact element 18 and the first fixed contact element 6, with consequent melting of one of the latter and, following upon subsequent cooling caused by interruption of supply of the programming current, formation of the weld. This weld can be subsequently removed in a way similar to what has been described previously.

In general, the use of low-stiffness portions, such as the first and second portions 107a, 107b, entails the possibility of reducing the length of the suspended element 106.

Albeit not shown, moreover possible are embodiments in which the suspended element 106 defines a single low-stiffness portion, for example arranged in a central position with respect to the suspended element 106 itself. For example, the low-stiffness portion may overly the first fixed contact element 6. In this case, the first mobile contact element 18 may be absent, and the low-stiffness portion, given that it has, for example, a V shape with its vertex facing the bottom surface S, may substitute the first mobile contact element 18, going into direct contact, in the second operating state, with the first fixed contact element 6.

In other embodiments (not shown), the suspended element 106 is V-shaped, and the first and second portions 107a, 107b are absent. Moreover, it is possible to apply a voltage between the first and second ends of the suspended element 106 for generating a flow of testing current to verify correct fabrication of the suspended element 106 itself.

Figure 17:
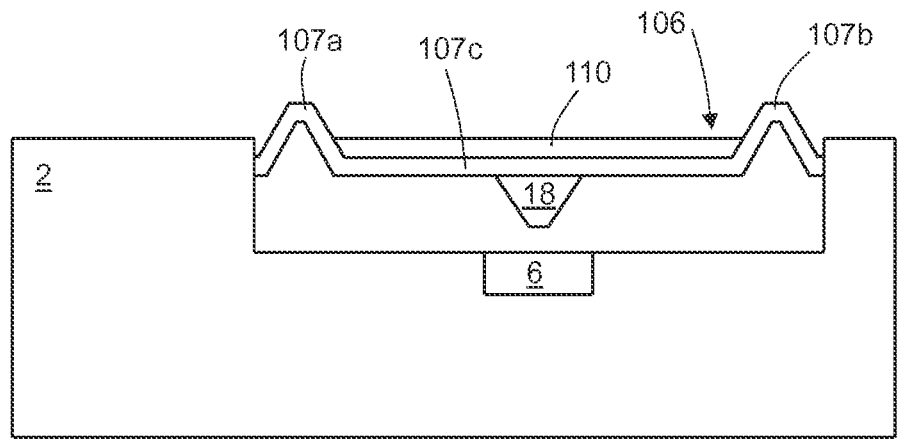

As shown in FIG. 17, moreover possible are hybrid embodiments, in which part of the suspended element 106, as likewise, for example, the third portion 107c, are coated with a coating layer 110, which has a coefficient of thermal expansion lower than the coefficient of thermal expansion of the suspended element 106 itself. In this case, the electromechanical memory element 1 does not include either the first conductive element 4 or the second conductive element 70, or again the first electronic circuit 8. In fact, bending of the first and second portions 107a, 107b, and hence translation of the third portion 107c of the suspended element 106 towards the first fixed contact element 6, is obtained by causing passage of the control current through the suspended element 106 and the coating layer 110, with consequent heating thereof.

Figure 18:
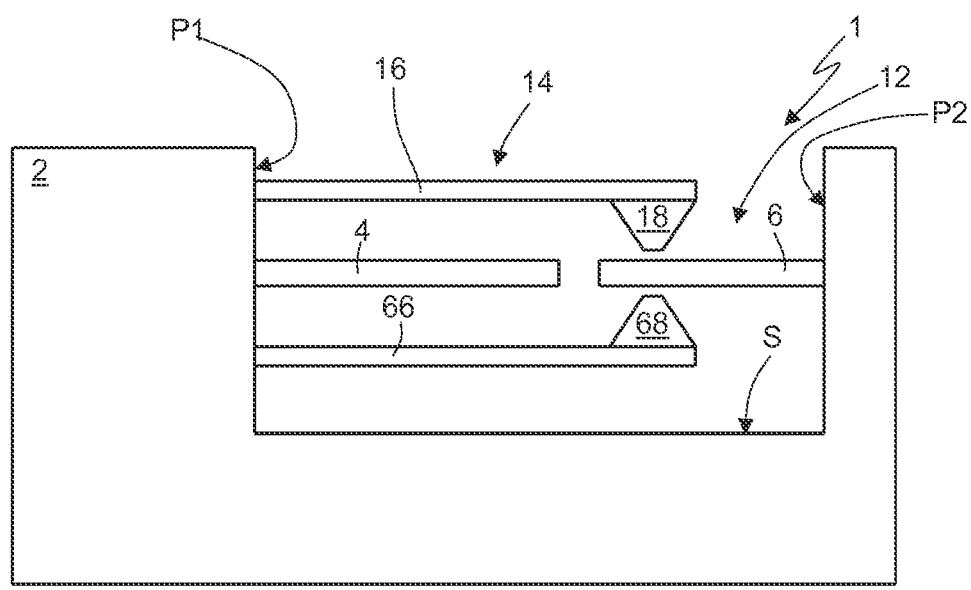

As shown in FIG. 18, moreover possible are embodiments including both the first cantilever element 16 and the second cantilever element 66, which are both constrained to the first side wall P1, the second cantilever element 66 underlying the first cantilever element 16 and overlying, at a distance, the bottom surface S of the recess 12. Furthermore, the second mobile contact element 68 is constrained to the second cantilever element 66 in such a way as to overly the second cantilever element 66 itself. In other words, in the first operating state, the first and second mobile contact elements 18, 68 are vertically aligned and face one another.

In the embodiment shown in FIG. 18, the first conductive element 4 and the first fixed contact element 6 are arranged externally with respect to the fixed supporting body 2. In particular, the first conductive element 4 extends in cantilever fashion from the first side wall P1 in such a way as to be arranged between the first and second cantilever elements 16, 66. The first fixed contact element 6 extends in cantilever fashion from the second side wall P2 and is horizontally aligned to the first conductive element 4. Consequently, the first fixed contact element 6 is arranged between the first and second mobile contact elements 18, 68. In the second operating state, the first mobile contact element 18 hence contacts at the top the first fixed contact element 6, whilst the second mobile contact element 68 contacts at the bottom the first fixed contact element 6. This embodiment hence enables storage of two bits. In addition, it develops in the vertical direction, reducing the occupation of area.

It is moreover possible for the first and second cantilever elements 16, 66 to be both constrained to the first side wall P1 and to be arranged coplanar. In this case, there can be present further cantilever elements, which are also constrained to the first side wall P1 and are coplanar. Furthermore, to each cantilever element there can be associated a respective conductive element and a respective fixed contact element. Alternatively, two or more cantilever elements can share a single conductive element and/or a single fixed contact element.

Figure 19:
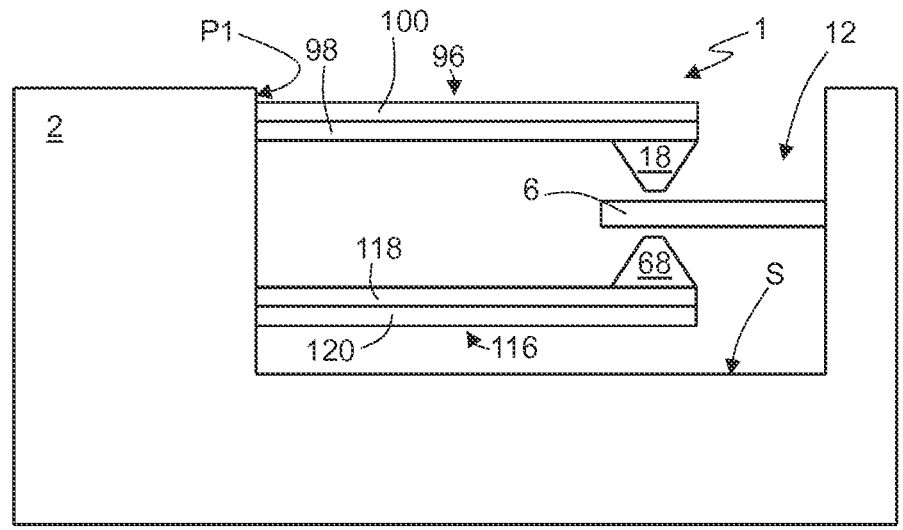

As shown in FIG. 19, it is moreover possible for each between the first and second cantilever elements to be of the type shown in FIG. 14. In detail, the first cantilever element (designated by 96) comprises the first and second layers 98 and 100, whilst the second cantilever element (designated by 116) comprises a third layer 118, made, for example, of the first material, and a fourth layer 120, made for example of the fourth material, which, as has been said, has a coefficient of thermal expansion higher than the coefficient of thermal expansion of the first material. More in particular, the third layer 118 overlies the fourth layer 120 in order to enable proper bending of the second cantilever element 116 towards the first fixed contact element 6. Furthermore, in order to enable passage of the control current both in the first cantilever element 96 and in the second cantilever element 116, the first, second, third, and fourth layers 98, 100, 118, 120 have all, in top plan view, one and the same U shape, the ends of this shape being constrained to the first side wall P1.

All the embodiments described are characterized in that they can be erased by means of heating, without using any current. In particular, by setting a source of heat in the proximity of the electromechanical memory element 1 and heating the latter in such a way that it will reach a temperature higher than the melting point of the first fixed contact element 6, or else of the first mobile contact element 18, there is obtained a removal of the weld and release of the first mobile body 14. In order to facilitate erasure of the electromechanical memory element 1, it is for example possible to make the first fixed contact element 6 of a material having a particularly low melting point, or else coat it with a layer with low melting point, the latter being possibly made, for example, of a so-called welding alloy.

Figure 20:
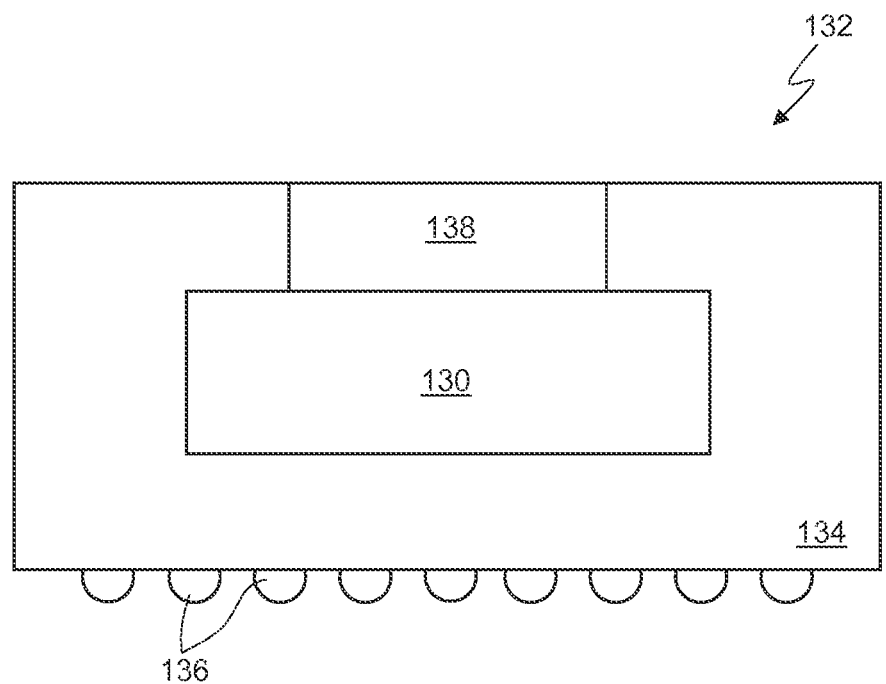
FIGS. 20 and 21 are schematic cross sections of integrated circuits containing the present electromechanical memory element.

As shown in FIG. 20, the electromechanical element 1 can moreover be formed inside a die 130 of an integrated circuit 132, which, in addition to the die 130, includes a package 134, extending underneath which is a plurality of projecting contact elements 136 (bumps), which belong to a substrate (not shown). The substrate is electrically connected to the die 130 in a way in itself known and can be formed, for example, by a printed circuit board (PCB). Present inside the package 134 is a region with high thermal conductivity 138, which is formed, for example, by a metal, is in direct contact with the die 130 and is designed to transmit to the die 130 the heat generated by a source of heat (not shown) arranged outside the integrated circuit 132. As shown in FIG. 20, the region with high thermal conductivity 138 may be of a through type, i.e., it may traverse the package 134 entirely, or else of a blind type, i.e., it may extend into the package 134 starting from the die 130, without traversing the package 134 completely. It is moreover possible for the region with high thermal conductivity 138 to extend inside the die 130.

Figure 21:
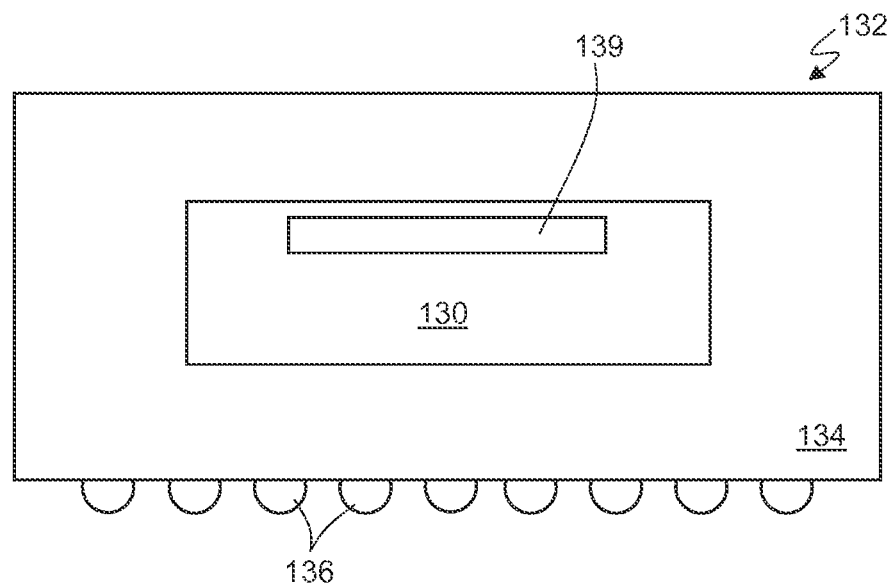

As shown in FIG. 21, inside the die 130 there may be arranged a heating element 139, such as, for example, a resistance. Alternatively, the heating element 139 may be arranged in contact with a surface of the die 130.

Figure 22:
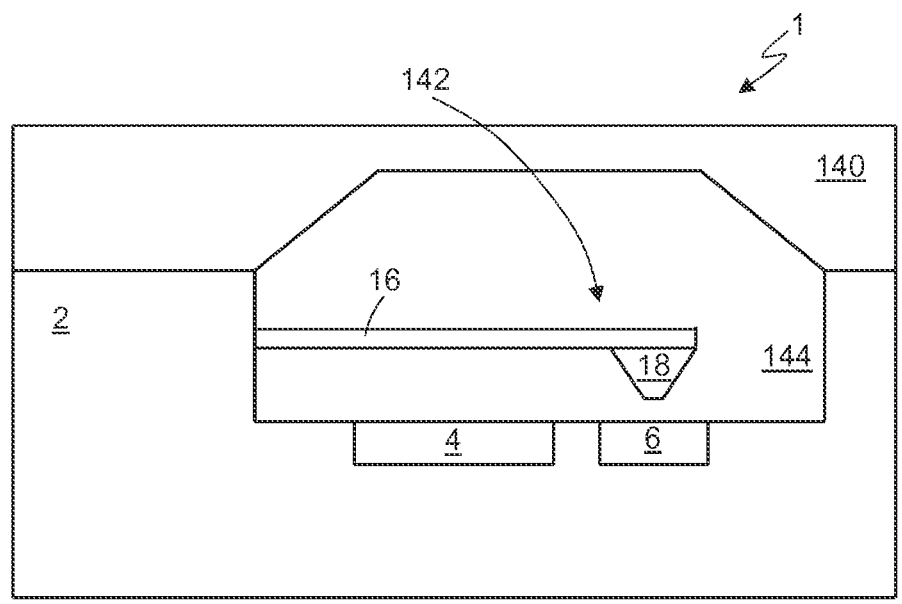
FIGS. 22 and 23 are schematic cross sections of further embodiments of the present electromechanical memory element.

As shown in FIG. 22 with reference, purely by way of example, to the embodiment illustrated in FIG. 1, the present electromechanical memory element 1 may moreover include a cap 140, which extends above the fixed supporting body 2 and the recess 12 in such a way as to close the recess, defining a closed cavity 142. In particular, the cap 140 may be formed, for example, by a semiconductor material or by a polymer. Furthermore, an inert fluid 144 may be present inside the closed cavity 142, such as, for example, a nitrogen gas. The inert fluid 144 prevents oxidation of the metal components of the electromechanical memory element 1, such as the first mobile contact element 18 and the first fixed contact element 6. Alternatively, the closed cavity 142 may be arranged in vacuum conditions.

Albeit not shown, in order to connect the electromechanical memory element 1 shown in FIG. 22 with the outside world, the electromechanical memory element 1 may include one or more vias of conductive material, also known as through-silicon vias (TSVs). The vias may extend vertically through the cap 140 and/or through the fixed supporting body 2, contacting corresponding metal pads (not shown). In particular, in the case of conductive vias that extend through the fixed supporting body 2, they traverse the body of semiconductor material 30 completely (FIG. 8), until they extend, possibly, in part inside the top region 32 (FIG. 8). Possibly, each via may traverse both the body of semiconductor material 30 and the top region 32 completely.

Even though in FIG. 22 an embodiment is shown in which the cap 140 coats the fixed supporting body 2 entirely, also possible are embodiments in which the cap 140 leaves a portion of the fixed supporting body 2 exposed, in which case the fixed supporting body 2 may be set in contact with the outside world through bumps or wire bonding, instead of vias.

Figure 23:
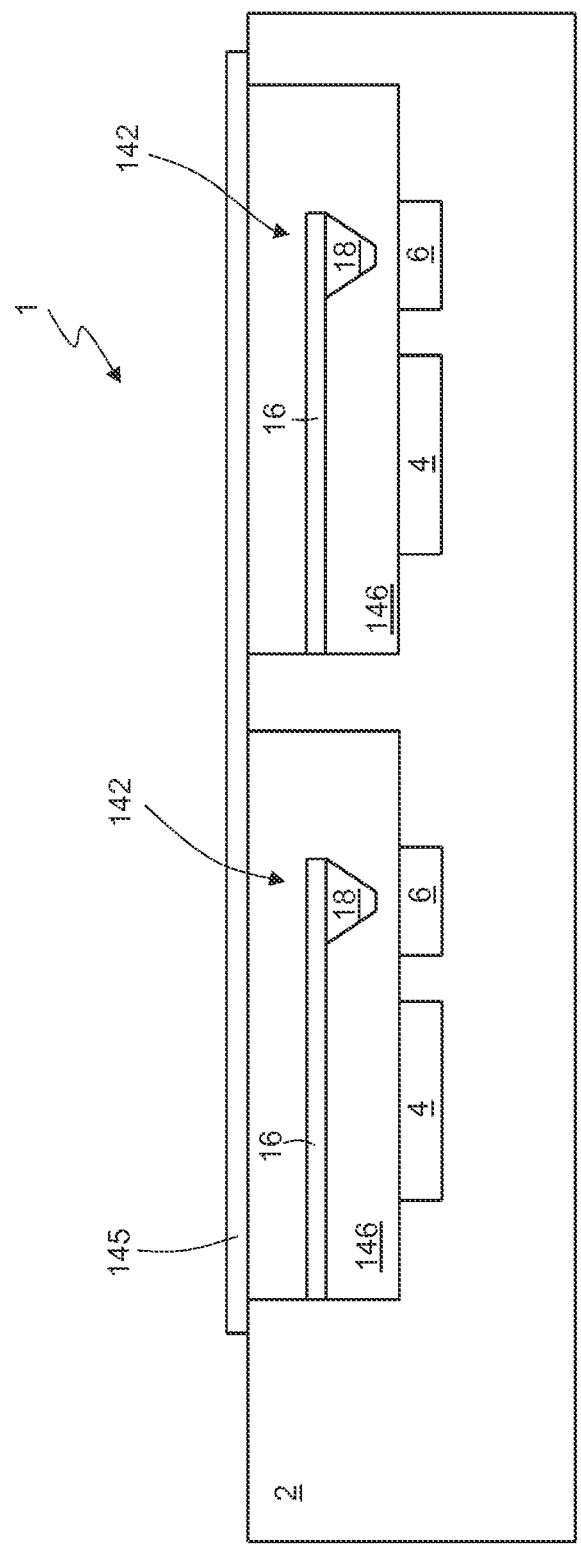

As shown in FIG. 23, it is moreover possible to form inside the fixed supporting body 2 a number of closed cavities 142 (in particular, in FIG. 23 two closed cavities are shown), inside which corresponding cantilever elements are present. In this case, present on top of the fixed supporting body 2 is a sealing layer 145, which extends over all the closed cavities 142 so as to seal them. For example, the sealing layer 145 may be made of a dielectric or polymeric material such as, for example, kapton. In this latter case, the sealing layer 145 may be preformed and subsequently glued on top of the fixed supporting body 2. Moreover, the sealing layer 145 may be transparent to facilitate visual inspection of the electromechanical memory element 1.

Inside the closed cavities 142 there may moreover be present, instead of a gas, a liquid 146, such as for example an oil or an aqueous solution. The liquid 146 can be introduced in the closed cavities 142 before closing thereof with the sealing layer 145, or else subsequently to laying of the sealing layer 145, in which case it is for example possible to provide microfluidic channels inside the fixed supporting body 2.

The liquid 146 may have a high dielectric constant (for example, higher than 2), in order to increase the capacitance of the first capacitor C1 (if present) in such a way as to enable a reduction of the dimensions of the first cantilever element 16 and of the first conductive element 4, given the same capacitance of the first capacitor C1. Furthermore, the liquid 146 may have a low viscosity (for example, lower than 1 Pa*s), in order not to hinder the movement of the first cantilever element 16.

The presence of the liquid 146 enables in any case damping of the inevitable mechanical rebounds that are generated when the first mobile contact element 18 comes into contact with the first fixed contact element 6, thus making it possible to anticipate supply of the programming current, the latter having to traverse the contact surface SC only after the rebounds are exhausted. The presence of the liquid 146 enables moreover lubrication of the first mobile contact element 18 and of the first fixed contact element 6, reducing wear thereof and prolonging the service life.

Figure 24:
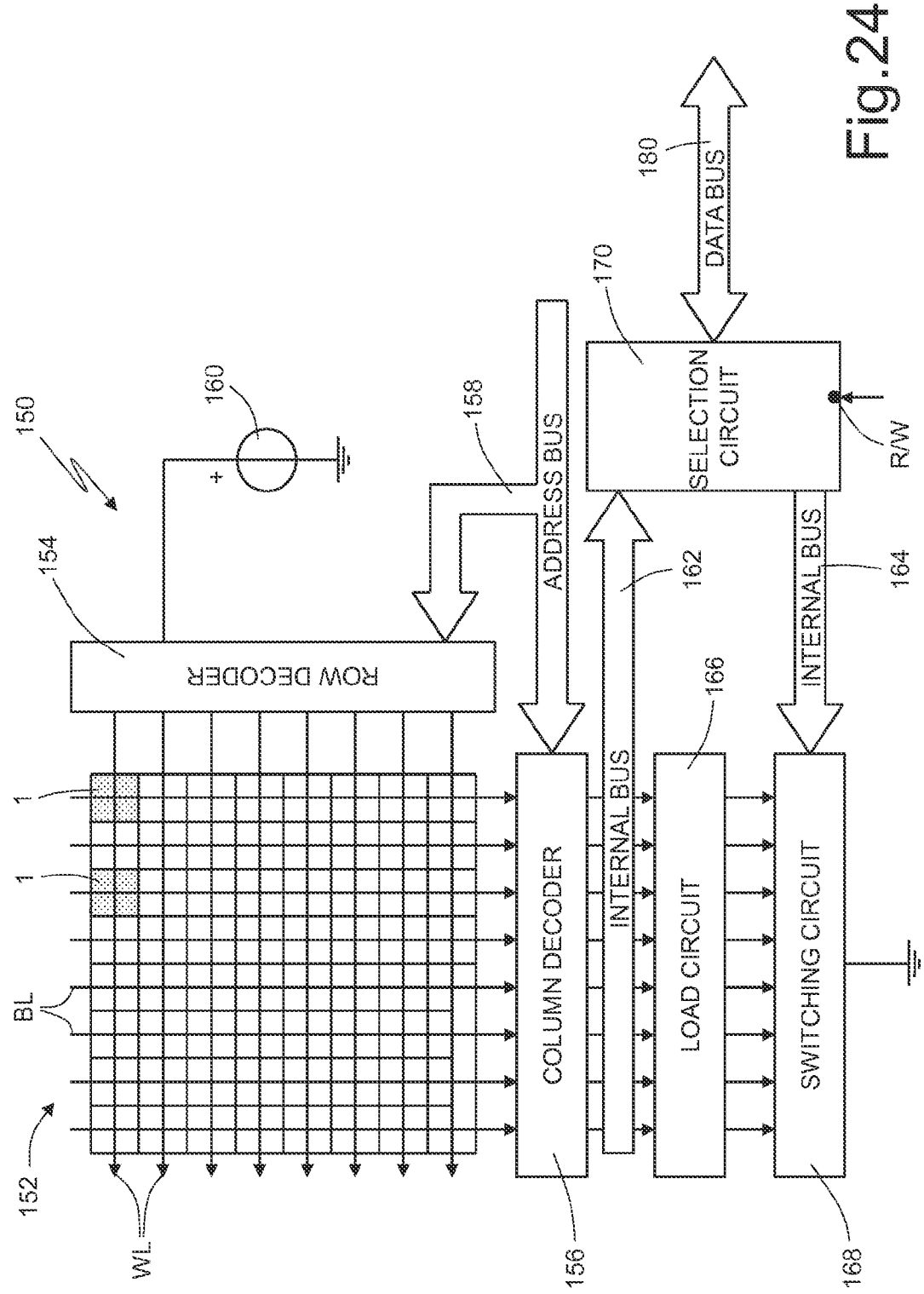
FIG. 24 shows a block diagram of an electromechanical memory.

Irrespective of the details of embodiment, a plurality of electromechanical memory elements 1 can be integrated to form an electromechanical memory 150, shown in FIG. 24. Before describing said electromechanical memory 150, it is pointed out that the first, second, third, and fourth electronic circuits 8, 10, 72, 88 previously described may be formed totally or partially outside the fixed supporting body 2 of the electromechanical memory element 1.

In detail, in an example of embodiment, the electromechanical memory 150 comprises a memory array 152 formed by the plurality of electromechanical memory elements 1, arranged in rows and columns. In particular, if the electromechanical memory elements are referred to as "memory cells", the memory cells of one and the same row are connected to a corresponding conductive path known as wordline WL. Moreover, the memory cells of one and the same column are connected to a corresponding conductive path known as bitline BL.

The electromechanical memory 150 further comprises a row decoder 154, connected to the wordlines WL, and a column decoder 156, connected to the bitlines BL. The row decoder 154 and the column decoder 156 are of a type in itself known and are connected to corresponding portions of an address bus 158, in such a way as to enable selection of a single wordline and of a single bitline.

The electromechanical memory 150 further comprises a voltage generator 160, which performs the functions of the aforementioned second electronic circuit 10 and is connected to the row decoder 154. In use, the row decoder 154 connects the voltage generator 160 to the wordline WL indicated by the address bus 158. In a variant not shown, the voltage generator 160 may be also external to the electromechanical memory 150.

The electromechanical memory 150 further comprises a first internal bus 162 and a second internal bus 164, a load circuit 166, a switching circuit 168 and a selection circuit 170. The load circuit 166 and the switching circuit 168 are connected together.

In detail, the load circuit 166 comprises a number of loads 172 (FIG. 25) equal to the number of bitlines BL, whilst the switching circuit 168 comprises a number of electronic switches 174 (FIG. 25) equal to the number of bitlines BL. In practice, each bitline BL is connected to a respective load 172 and to a respective electronic switch 174. The generic load 172 may be, for example, a resistance or a load of an active type, created with electronic circuits of a known type.

In greater detail, the selection circuit 170 can be controlled through a respective read/write (R/W) input and can operate alternatively in a first mode or else in a second mode. In addition, the selection circuit 170 receives at input a data bus 180 (of a bidirectional type) and is connected to the first and second internal buses 162, 164. In turn, the second internal bus 164 is connected to the switching circuit 168, whilst the first internal bus 162 can be coupled to the column decoder 156 in a controllable way by the selection circuit 170 (characteristic not shown in FIG. 24), as described hereinafter.

In the first mode, the selection circuit 170 sets the column decoder 156 in electrical contact with the load circuit 166, i.e., it decouples the first internal bus 162 from the column decoder 156. Moreover, the selection circuit 170 connects the data bus 180 to the second internal bus 164.

In the second mode, the selection circuit 170 couples the first internal bus 162 to the column decoder 156 and controls the switching circuit 168 in such a way that it is electrically equivalent to a plurality of open circuits (characteristic not shown in FIG. 24). In addition, the selection circuit 170 connects the data bus 180 to the first internal bus 162.

Figure 25:
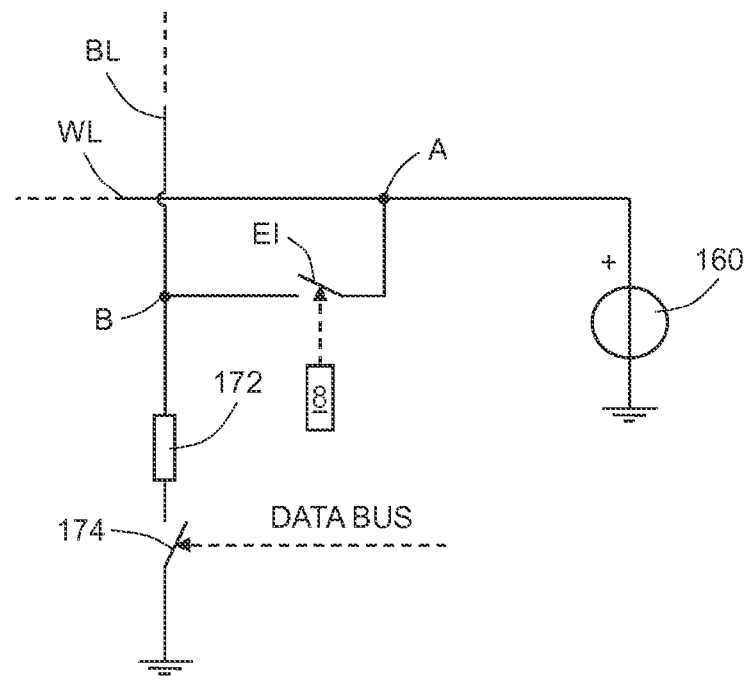
FIG. 25 shows an equivalent electric diagram of a portion of the electromechanical memory shown in FIG. 24.

As shown in FIG. 25, where for simplicity reference is made to the case of a memory array formed by a single memory cell, and hence in which the row and column decoders are not present, each electromechanical memory element 1 is electrically equivalent to an electromechanical switch EI, which is connected between a respective wordline WL and a respective bitline BL.

Assuming, by way of example, that the single memory cell is formed by the electromechanical memory element shown in FIG. 1, the electromechanical switch EI is controlled by the first electronic circuit 8, which, as has been said, may be formed outside the fixed supporting body 2, or else can be controlled by an external unit (not shown). In what follows, reference is hence made, for simplicity, to the first electronic circuit 8, implying a possible control thereof by the external unit.

When the selection circuit 170 operates in the first mode, the bitline BL is connected to a corresponding load 172, which is connected to a corresponding electronic switch 174. The electronic switch 174 is controlled by the second internal bus 164, and hence by the data bus 180.

In particular, the electronic switch 174 is controlled by the portion of the data bus 180 connected to the portion of the second internal bus 164 that controls directly the electronic switch 174. However, for brevity, in what follows reference is generically made to the data bus 180 to indicate the element that controls closing/opening of the electronic switch 174. This being said, the electronic switch 174 is closed when the data bus 180 indicates a corresponding logic value '1'; otherwise, it is open. Consequently, it is possible to form a weld inside the electromechanical memory element 1, and hence to store a bit '1' only when the logic value indicated by the data bus 180 is equal to '1'.

Figure 26:
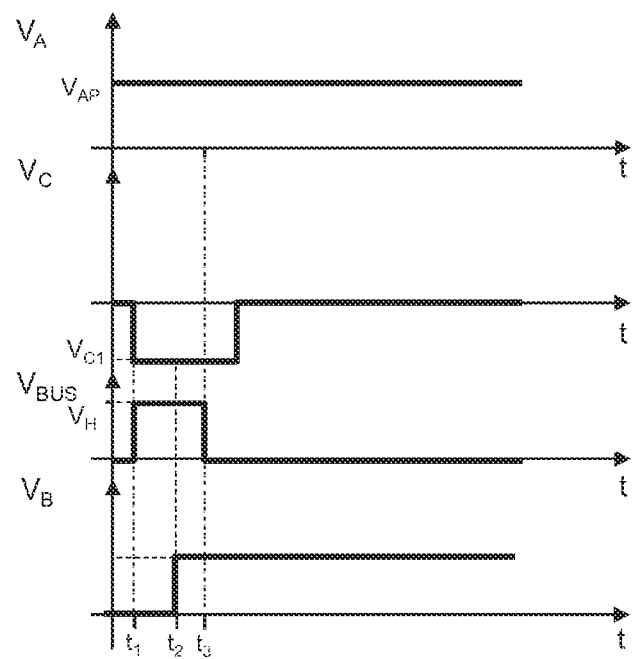
FIGS. 26-30 show time plots of electrical signals inside the electromechanical memory.

In detail, if designated by A and B are the nodes of the electronic switch EI connected, respectively, to the voltage generator 160 and to the load 172, during programming of the logic value '1' the signals shown in FIG. 26 are generated. In particular, in FIG. 26 it is assumed that the electromechanical memory element 1 is initially in the first operating state, and hence stores the logic value '0', since there is no contact (or weld) between the first mobile contact element 18 and the first fixed contact element 6.

In greater detail, if t is the time, the voltage $V_A$ on the node A is equal to a non-zero value $V_{AP}$. At an instant $t_1$, the first electronic circuit 8 applies a (negative) voltage $V_{C1}$ to the first conductive element 4 in order to close the electromechanical switch EI (in FIG. 26, the voltage on the first conductive element is designated by Vd. Closing of the electromechanical switch EI requires a certain time and takes place at an instant $t_2$. Furthermore, it is assumed that, subsequently to the instant $t_1$, the voltage $V_{BUS}$ on the data bus 180 (to be precise, as has been said, on the portion of the data bus connected to the portion of the second internal bus that controls directly the electronic switch) is equal to $V_H$, where $V_H$ is a voltage that indicates the logic value '1', i.e., such as to close the electronic switch 174. Consequently, following upon the instant $t_2$, there occurs passage of the programming current through the electromechanical switch EI, with consequent passage of the voltage $V_B$ on the node B from a zero value to a non-zero value, as well as with consequent partial melting, for example, of the first fixed contact element 6. Subsequently, at an instant $t_3$, the data bus 180 is set to a zero voltage. Cooling that results therefrom entails formation of the weld between the first mobile contact element 18 and the first fixed contact element 6, and hence the voltage $V_B$ does not vanish after the instant $t_3$. The voltage $V_C$ remains at the voltage value $V_{C1}$ for a certain period of time after the instant $t_3$, in order to keep the first mobile contact element 18 and the first fixed contact element 6 in contact during formation of the weld. In this way, the memory cell is programmed and stores the logic value '1'.

Possibly, the electronic switch 174 can be controlled in such a way that it closes only starting from the instant when both of the following conditions are verified: i) the data bus 180 indicates the logic value '1'; and ii) the electromechanical switch EI is closed. In this way, the degradation of the electrical contact between the first mobile contact element 18 and the first fixed contact element 6 is reduced, because the flow of the current and the sparks during the mechanical rebounds that are generated when the first mobile contact element 18 is in contact with the first fixed contact element 6 are prevented.

It should be noted that, in the case where the data bus 180 indicates a logic value '0', the procedure described previously does not lead to formation of any weld, since the electronic switch 174 remains open and hence does not enable passage of the programming current. In this way, inside the memory cell the logic value '0' is correctly stored.

When the selection circuit 170 operates in the first mode it is hence possible to program the memory cell. In addition, it is possible to erase the logic value '1' possibly stored in the memory cell. In other words, it is possible to reset the memory cell, restoring a condition such that the memory cell stores the logic value '0'.

Figure 27:
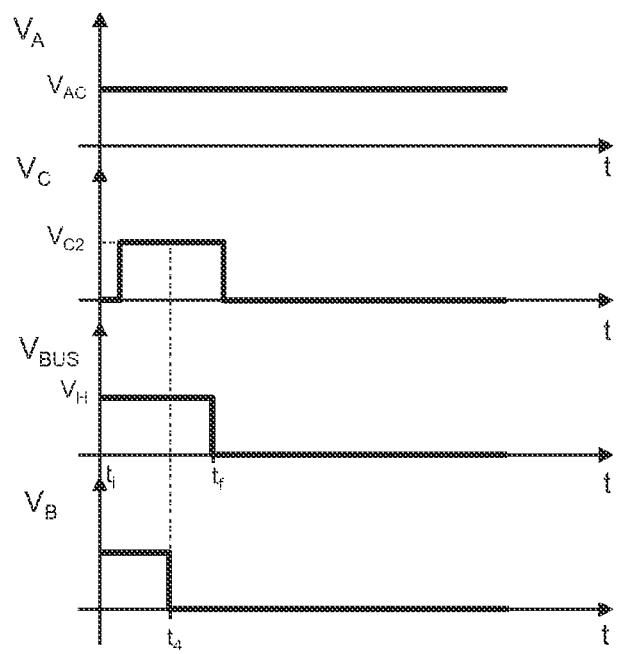

In order to reset the memory cell, as shown in FIG. 27, the voltage generator 160 remains on throughout the operations, in such a way that the voltage $V_A$ is equal to a non-zero value $V_{AC}$. In addition, the data bus 180 is set at the voltage $V_H$ during a time interval comprised between an instant $t_i$ and an instant $t_f$ so as to close the electronic switch 174. In addition, the first conductive element 4 is not biased, or else, as shown precisely in FIG. 27, applied thereto is a voltage $V_{C2}$, so as to generate a repulsive force between the first conductive element 4 and the first cantilever element 16. Passage of erasure current through the contact surface SC and the weld 20 thus causes melting of the weld and consequent release of the first cantilever element 16. This release occurs, for example, at an instant $t_4$, following upon which the voltages $V_C$ and $V_{BUS}$ are set to zero.

Figure 28:
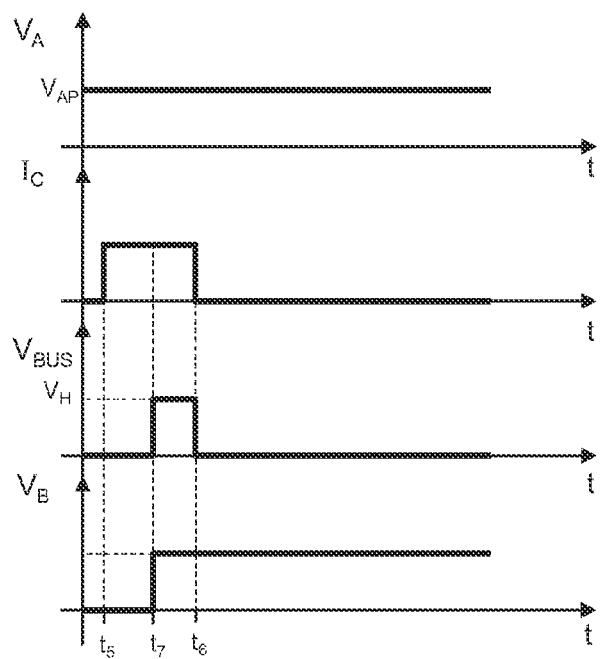

In the case where the electromechanical memory element 1 is of the type illustrated in FIGS. 14 and 15, programming and erasure occur, for example, on the basis of the signals shown in FIG. 28.

In particular, the programming operation envisages turning-on of the voltage generator 160 and causing passage of the control current (designated by $I_C$ in FIG. 28) inside the first and second layers 98, 100, from an instant $t_5$ and up to an instant $t_6$. The voltage $V_A$ on the node A is once again equal to the value $V_{AP}$, throughout the programming operations.

In addition, at an instant $t_7$, comprised between the instants $t_5$ and $t_6$, the data bus 180 is set to the voltage $V_H$, so as to close the electronic switch 174. In particular, the instant $t_7$ is subsequent to the instant in which, on account of passage of the control current, contact has taken place between the first mobile contact element 18 and the first fixed contact element 6. Consequently, following upon this instant $t_7$, there occurs passage of the programming current, with consequent raising of the voltage $V_B$ on the node B. The data bus 180 is subsequently set to a zero voltage, for example at the instant $t_6$, in order to interrupt passage of the programming current, with consequent solidification of the weld. In a variant not shown, the control current $I_C$ (in a way similar to the voltage $V_C$ of FIG. 26) can continue to flow inside the first and second layers 98, 100 for a certain period of time after the instant $t_6$ in order to keep the first mobile contact element 18 and the first fixed contact element 6 in contact during the step of formation of the weld.

Figure 29:
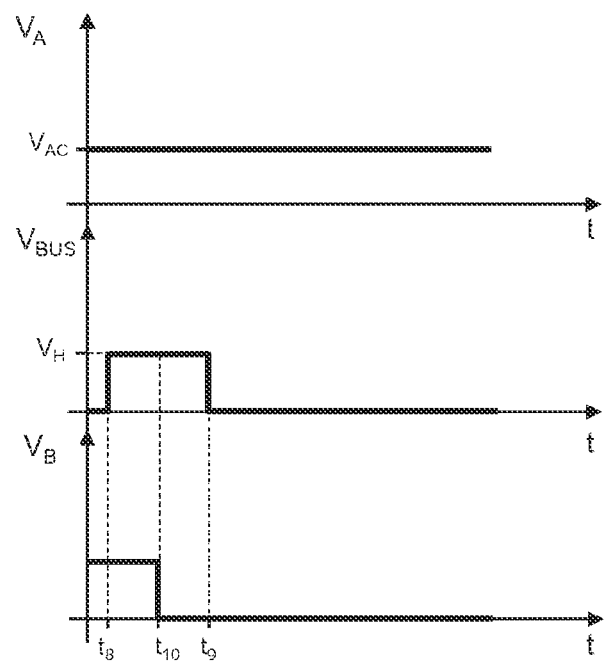

As regards the operation of erasure, as shown in FIG. 29, the voltage generator 160 remains on throughout the operation, in such a way that the voltage $V_A$ on the node A remains equal to the value $V_{AC}$, throughout the erasure operations. Furthermore, the data bus 180 is set at the voltage $V_H$ during a time interval comprised between the instants $t_8$ and $t_9$. In this way, there occurs passage of a current through the contact surface SC and the weld, with consequent destruction of the weld and release of the first cantilever element 16. In particular, the release of the first cantilever element 16 entails vanishing of the voltage $V_B$ on the node B, at an instant $t_{10}$ comprised between the instants $t_8$ and $t_9$.

Figure 30:
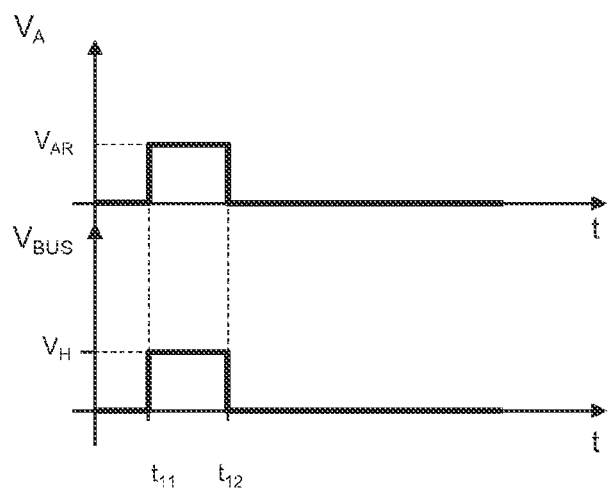

As regards the so-called reading operations, the selection circuit 170 operates in the second mode, as has been said previously, in such a way that the electronic switches 174 are open and the first internal bus 162 is connected to the column decoder 152. Furthermore, as shown in FIG. 30, and irrespective of the embodiment, the voltage generator 160 remains on during a time interval comprised between the instants $t_{11}$ and $t_{12}$ and sets the voltage $V_A$ in such a way that it is equal to a value $V_{AR}$. In this way, in the presence of the weld (logic state '1'), the voltage $V_{BUS}$ on the data bus 180 goes, during the time interval comprised between the instants $t_{11}$ and $t_{12}$, to a high level, whilst, in the absence of the weld (logic state '0'), the voltage $V_{BUS}$ on the data bus 180 remains zero. In particular, the value $V_{AR}$ is such that, through the contact surface SC, there occurs passage of a reading current lower than the programming and erasure currents, this reading current being such as not to cause melting of the weld, if present. In this way, the reading operations do not alter the state of the memory cell.

This being said, numerous variants of the electromechanical memory 150, as well as of the operations regarding its functioning, are in any case possible. For example, the load circuit 166 may be arranged between the row decoder 154 and the memory array 152. In addition, the switching circuit 168 can be controlled on the basis both of the data bus 180 and of the address bus 158. In addition, it is possible for one or both between the row decoder 154 and the column decoder 156, in addition to other parts of the electromechanical memory 150, to be formed by mechanical switches including respective electromechanical memory elements.

The advantages that the present electromechanical memory element affords emerge clearly from the foregoing description. In particular, it represents an integrated memory element of a mechanical and nonvolatile type, which is easily reproducible and consequently enables high-reliability memories to be obtained. In particular, the present electromechanical memory element enables storage of information for periods of time of the order of tens or hundreds of years in a reliable way, without resorting to techniques of storage of the electrical charge. In addition, it presents a high immunity to electromagnetic radiation.

Finally, it is clear that modifications and variations may be made to what is described and illustrated herein, without thereby departing from the sphere of protection of the present invention, as defined in the annexed claims.

For example, the electromechanical memory element can be designed to implement just one writing operation in such a way as to define a so-called non-erasable one-time programmable (OTP) memory element.

Furthermore, there may be present rows and/or columns of electromechanical memory elements used for redundancy, as well as additional electronic circuitry and electromechanical memory elements of a so-called "content-addressable" type. It is thus possible to repair the electromechanical memory 150 during the steps of testing or during its normal operation by replacing a faulty electromechanical memory element. There may moreover be present so-called BISTAR (Built-In Self Test with Auto-Redundancy) circuits, which function as redundancy elements of the electromechanical memory elements that have been damaged during the service life of the electromechanical memory 150.

What is claimed is:

1. An apparatus including an electromechanical memory element, comprising:
    a fixed supporting body;
    a first mobile device including a first deformable element constrained to said fixed supporting body, said first mobile device defining a first mobile contact element;
    a fixed contact element fixed with respect to the fixed supporting body;
    an actuator configured to deform the first deformable element between a first position, where the first mobile contact element is separate from the fixed contact element, and a second position, where the first mobile contact element is in contact with the fixed contact element, said first and second positions being associable to two different logic states; and
    a programming circuit configured to co-operate with the actuator to:
        form a weld between the first mobile contact element and the fixed contact element when the first deformable element is in the second position; and
        remove the weld between the first mobile contact element and the fixed contact element to permit return of the first deformable element to the first position.

2. The apparatus according to claim 1, wherein the first deformable element is made at least in part of a first material, the fixed contact element and the first mobile contact element being made, respectively, of a second material and a third material; and wherein, when the first mobile device is in the second position, the first mobile contact element and the fixed contact element define a contact surface, the programming circuit further configured to cause a programming current to flow through said contact surface, causing an increase in temperature of the contact surface; and wherein at least one of the second and third materials has a melting point lower than the melting point of the first material, said increase in temperature of the contact surface being such as to cause melting of said at least one material.

3. The apparatus according to claim 2, wherein the first deformable element is formed by a first region, made of the first material, and by a second region, made of a fourth material, the first and fourth materials having different coefficients of thermal expansion, the first and second regions being such that an increase in temperature of the first deformable element causes bending of the first deformable element in the direction of the fixed contact element.

4. The apparatus according to claim 3, wherein the actuator and the first deformable element define, when the first mobile device is in the first position, a closed conductive path, the actuator further configured to cause an actuation current to flow along said closed conductive path in such a way as to cause said increase in temperature of the first deformable element.

5. The apparatus according to claim 1, wherein the first deformable element defines a first plate of a capacitor, and the actuator comprises a first conductive element, which is fixed with respect to the fixed supporting body and defines a second plate of said capacitor, and a biasing circuit configured to bias said capacitor in such a way as to apply an electrostatic force to the first deformable element.

6. The apparatus according to claim 1, wherein the first mobile contact element is defined by the first deformable element.

7. The apparatus according to claim 1, wherein the first mobile device further comprises an additional contact element, which is constrained to the first deformable element and defines said first mobile contact element.

8. The apparatus according to claim 1, wherein the fixed supporting body defines a cavity, the first mobile device extending inside said cavity.

9. The apparatus according to claim 8, wherein the first deformable element extends in cantilever fashion from the fixed supporting body.

10. The apparatus according to claim 8, wherein the cavity is delimited by a surface defined by the fixed supporting body; and wherein the first deformable element comprises a first low-stiffness portion and a second low-stiffness portion and a high-stiffness portion, the high-stiffness portion being arranged between the first and second low-stiffness portions, the first and second low-stiffness portions being constrained to the fixed supporting body in such a way that the high-stiffness portion overlies said surface, the actuator configured to deform the first and second low-stiffness portions in such a way as to cause a translation of the high-stiffness portion in a direction substantially perpendicular to said surface.

11. The apparatus according to claim 8, wherein the cavity is closed by a sealing element and contains a fluid.

12. The apparatus according to claim 1, further comprising a second mobile device, which includes a second deformable element and defines a second mobile contact element, the actuator further configured to deform the second deformable element so as to set the second mobile device in a third position, where the second mobile contact element is separate from the fixed contact element, or in a fourth position, where the second mobile contact element is in contact with the fixed contact element.

13. The apparatus according to claim 1, further comprising a plurality of said electromechanical memory elements arranged in an array to form an electronic memory.

14. An apparatus including an electromechanical memory element, comprising:
a supporting body including a cavity;
a mobile contact element extending into said cavity;
a fixed contact element located within said cavity;
an actuator configured to cause movement of said mobile contact element within said cavity between a first position where the mobile contact element is separated from the fixed contact element and a second position where the mobile contact element is in contact with the fixed contact element;
a programming circuit configured to cause a weld:
to be formed between the mobile contact element and the fixed contact element when at the second position; and
to be dissolved between the mobile contact element and the fixed contact element to return the first position.

15. The apparatus of claim 14, wherein the actuator is an electrostatic actuator.

16. The apparatus of claim 14, where the actuator is a thermal actuator.

17. The apparatus of claim 14, wherein the mobile contact element has a distal end, and at the second position the distal end of the mobile contact element is in contact with the fixed contact element.

18. The apparatus of claim 14, wherein programming circuit includes a source of current selectively applied during programming across a contact made between the mobile contact element and the fixed contact element when at the second position.

19. The apparatus of claim 18, further comprising a sensor circuit coupled to the mobile contact element and configured to detect said current.

20. The apparatus of claim 14, further comprising a meltable contact element associated with the mobile contact element, said meltable contact element forming said weld.

21. The apparatus of claim 14, further comprising a meltable contact element associated with the fixed contact element, said meltable contact element forming said weld.

22. The apparatus of claim 14, wherein the cavity is closed by a sealing element and contains a fluid.

23. The apparatus of claim 14, further comprising a plurality of said electromechanical memory elements arranged in an array to form an electronic memory.

24. A method, comprising:
applying a force to move a mobile contact element from a first position where the mobile contact element is separated from the fixed contact element to a second position where the mobile contact element is in contact with the fixed contact element;
passing a first programming current through the mobile contact element and fixed contact element while the force is applied to cause a weld to be formed between the mobile contact element and the fixed contact element when at the second position;
not applying the force; and
passing a second programming current through the mobile contact element and fixed contact element while the force is not applied to cause a weld to melt and release contact between the mobile contact element and the fixed contact element so as to allow return back to the first position.

25. The method of claim 24, wherein applying comprises applying an electrostatic force.

26. The method of claim 24, wherein applying comprises applying a thermal force.

\* \* \* \* \*